(12) United States Patent
Koyama

(10) Patent No.: US 6,380,007 B1
(45) Date of Patent: Apr. 30, 2002

(54) SEMICONDUCTOR DEVICE AND MANUFACTURING METHOD OF THE SAME

(75) Inventor: Jun Koyama, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/468,918

(22) Filed: Dec. 22, 1999

(30) Foreign Application Priority Data

Dec. 28, 1998 (JP) ............................................ 10-374884

(51) Int. Cl.$^7$ .......................... H01L 21/00; H01L 21/84

(52) U.S. Cl. ....................... 438/151; 438/156; 438/157; 438/166

(58) Field of Search ................................ 438/156, 157, 438/166, 151, 160; 257/66, 47, 69, 59, 350, 78

(56) References Cited

U.S. PATENT DOCUMENTS

| | | |
|---|---|---|
| 5,247,190 A | 9/1993 | Friend et al. |
| 5,399,502 A | 3/1995 | Friend et al. |
| 5,594,569 A | 1/1997 | Konuma et al. |
| 5,608,232 A | 3/1997 | Yamazaki et al. |
| 5,639,698 A | 6/1997 | Yamazaki et al. |
| 5,744,822 A | 4/1998 | Ohtani |
| 5,843,225 A | 12/1998 | Takayama et al. |
| 5,879,977 A | 3/1999 | Zhang et al. |
| 5,897,347 A | 4/1999 | Yamazaki et al. |
| 5,956,579 A | 9/1999 | Yamazaki et al. |
| 6,013,930 A * | 1/2000 | Yamazaki et al. ........... 257/353 |
| 6,083,574 A * | 7/2000 | Asao et al. .................... 428/1.1 |
| 6,087,245 A * | 7/2000 | Yamazaki et al. ........... 438/486 |
| 6,133,075 A * | 10/2000 | Yamazaki et al. ........... 438/158 |
| 6,147,667 A * | 11/2000 | Yamazaki et al. ............. 345/92 |
| 6,153,445 A * | 11/2000 | Yamazaki et al. ............. 438/30 |

FOREIGN PATENT DOCUMENTS

| | | |
|---|---|---|
| JP | 6-232059 | 8/1994 |
| JP | 6-244103 | 9/1994 |
| JP | 6-244104 | 9/1994 |
| JP | 7-321339 | 12/1995 |
| JP | 8-15686 | 1/1996 |
| JP | 10-92576 | 4/1998 |
| WO | WO 90/13148 | 11/1990 |

OTHER PUBLICATIONS

Furue et al., Characteristics and Driving Scheme of Polymer–Stabilized Monostable FLCD Exhibiting Fast Response Time and High Contrast Ratio with Gray–Scale Capability, SID 98 Digest, pp. 782–785, 1998, No month.

Yoshida et al., "A Full–Color Thresholdless Antiferroelectric LCD Exhibiting Wide Viewing Angle with Fast Reponse Time", SID 97 Digest, pp. 841–844, 1997, No month.

Inui et al., "Thresholdless Antiferroelectricity in Liquid Crystals and its Application to Displays", J. Mater. Chem., 1996, 6(4), pp. 671–673, No month.

Terada et al., "Half–V Switching Mode FLCD", Proceedings of the 46th Applied Physics Association Lectures, 28P–V–8, p. 1316, Mar. 1999.

(List continued on next page.)

Primary Examiner—Michael S. Lebentritt
(74) Attorney, Agent, or Firm—Eric J. Robinson; Nixon Peabody LLP

(57) ABSTRACT

A Ni film is formed in contact with a semiconductor film from an amorphous silicon film, a microcrystalline silicon film, etc. The semiconductor film is heated at between 450 and 650° C., moving the Ni, and forming a crystalline semiconductor film. Next, a group 15 element is selectively doped into the crystalline semiconductor film including a region that becomes a source region and a drain region, forming a group 15 element doped region. Heat treatment is performed next at between 500 and 850° C., and the crystallization promoting element remaining in a region to be gettered is absorbed by the group 15 element doped region.

44 Claims, 25 Drawing Sheets

OTHER PUBLICATIONS

Yoshihara et al., "Time Division Full Color LCD by Ferro-electric Liquid Crystal", EKISHO, vol. 3, No. 3., pp. 190–194, 1999, No month.

Hermann Schenk et al., "Polymers for Light Emitting Diodes", EuroDisplay '99 Proceedings, pp. 33–37, 1999 No month.

* cited by examiner

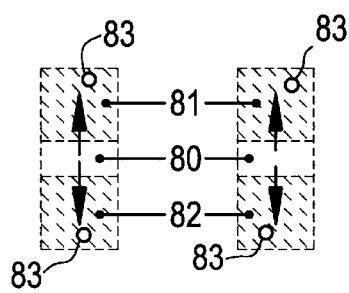
FIG. 1A
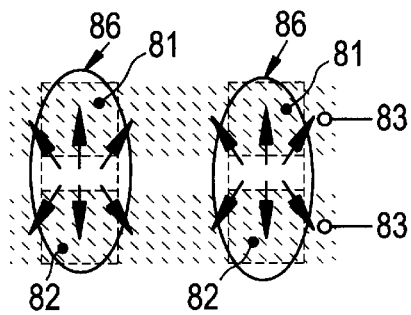
FIG. 1B
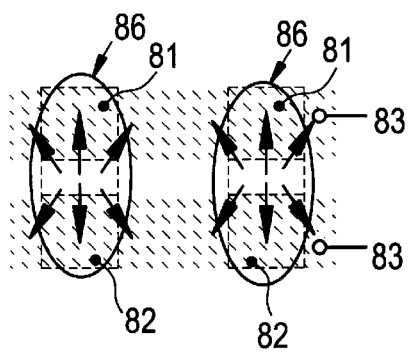
FIG. 1C
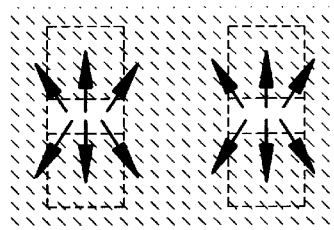
FIG. 1D
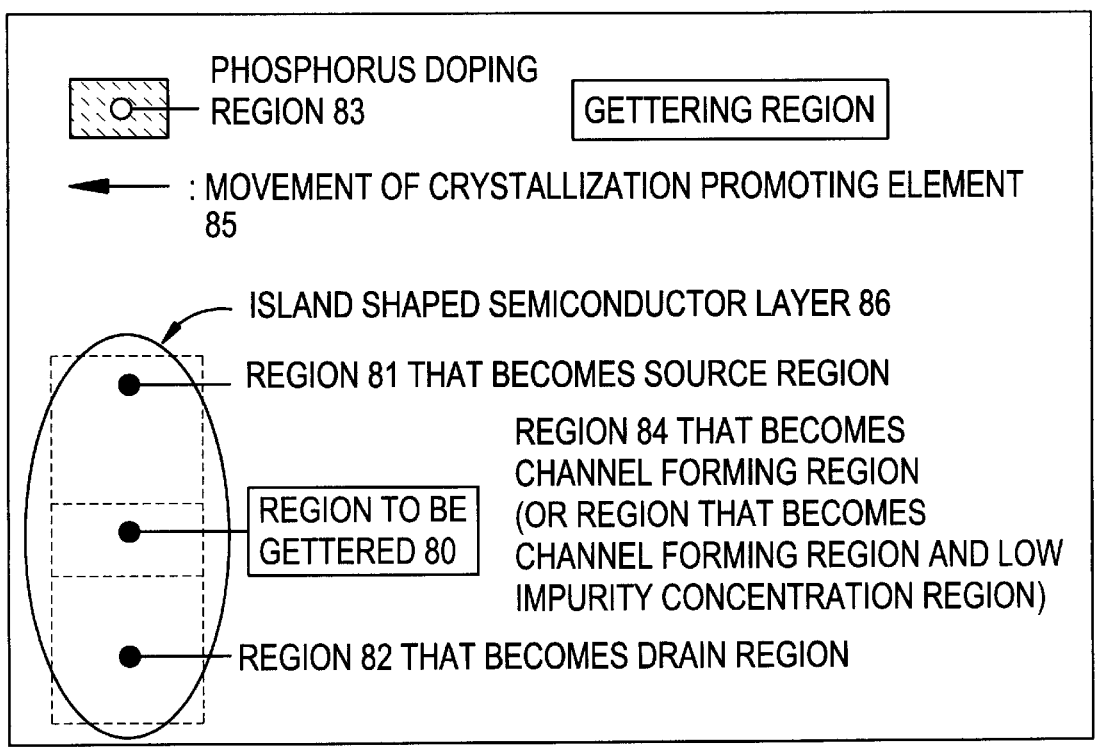

N-CHANNEL TYPE TFT CROSS-SECTION -1     P-CHANNEL TYPE TFT CROSS-SECTION -2

SEMICONDUCTOR DEVICE AND MANUFACTURING METHOD OF THE SAME

BACKGROUND OF THE INVENTION

1. Field of the Invention

The present invention relates to a method of manufacturing a semiconductor device by using a crystaline semiconductor film. Note that the semiconductor device of the present invention includes as the categories thereof not only elements such as thin film transistors and MOS transistors, but also electronic equipment having semiconductor circuits constituted by these kinds of insulating gate type semiconductor elements, and electronic equipment such as personal computers and digital cameras, configured with an electro-optical display device (typically a liquid crystal display device) made from an active matrix substrate.

2. Description of the Related Art

Thin film transistors (TFTs) are currently known as the semiconductor elements that use a semiconductor film. TFTs are used in all types of integrated circuits, but are especially used as switching elements for matrix circuits in active matrix type liquid crystal display devices. In addition, in recent years increase of TFT mobility has been progressing, and TFTs are also used as elements in driver circuits that drive matrix circuits. In order to be used in a driver circuit, it is necessary to use a crystalline silicon film, which has a higher mobility than an amorphous silicon film, as a semiconductor layer. This crystalline silicon film is called polycrystalline silicon, polysilicon, microcrystalline silicon, etc.

Conventional methods known to form a crystalline silicon film are a method of direct deposition of a crystalline silicon film, and a method of crystallizing an amorphous silicon in which an amorphous silicon is deposited by CVD, and then heat treatment is performed at 600 to 1,100° C. for between 20 and 48 hours. A crystalline silicon film formed by the latter method has larger crystal grains, and the characteristics of a manufactured semiconductor element are good.

If a crystalline silicon film is formed on a glass substrate by the latter method, the upper limit for the crystallization process temperature is approximately 600° C., and a long time period is required for the crystallization process. Further, a 600° C. temperature is close to the lowest temperature at which silicon will crystalize, and if it becomes 500° C. or lower, it is impossible to perform crystallization in an industrially reasonable period of time.

In order to shorten the crystallization time, a quartz substrate with a high distortion point may be used, and the Air crystallization temperature may be raised to approximately 1,000° C., but compared with a glass substrate, a quartz substrate is extremely high priced, and it is difficult to obtain a large surface area. For example, Corning 7059 glass, which is widely used in active type liquid crystal display devices, has a distortion point of 593° C., and at a temperature of 600° C. or greater for several hours, shrinking or bending of the substrate develops. Therefore, there is a demand to lower the temperature and shorten the period of time of the crystallization process so as to be able to use a glass substrate like Corning 7059 glass.

An excimer laser crystallization technique is one technique with which it is possible to lower the process temperature and shorten the process time. In a short time, excimer laser light can impart energy to the semiconductor film, which is equivalent to that of thermally annealing at approximately 1,000° C., while imparting almost no thermal influence on the substrate, and a semiconductor film with good crystallinity can be formed. However, energy distribution onto the irradiation surface by an excimer laser is uneven, so that the crystallinity of the crystalline semiconductor film obtained is also uneven, and the fluctuation of elemental characteristics is also seen for every TFT.

Therefore, the applicant of the present invention discloses techniques of lowering the crystallization temperature, while employing heat treatment, in Japanese Patent Application Laid-open No. Hei 6-232059, Japanese Patent Application Laid-open No. Hei 7-321339, etc. The technique disclosed in the above-mentioned publications is a technique in which a trace amount of an element that promotes crystallization (referred to as crystallization promoting element, for convenience) is introduced as a catalyst, and a crystalline silicon film is obtained by subsequently performing heat treatment. An element selected from the groups consisting of Ni, Fe, Co, Ru, Rh, Pd, Os, Ir, Pt, Cu, Au, and Ge is used as the element that promotes crystallization.

In the crystallization disclosed in the above-mentioned publications, the crystallization promoting element moves (diffuses) within the amorphous silicon film due to heat treatment, and the crystallization of the amorphous silicon is promoted. Employment of the crystallization technique disclosed in the publications above enables to form crystalline silicon by heat treatment at between 450 and 600° C. for 4 to 24 hours, and thus use of a glass substrate becomes possible.

However, there is a problem with the above published crystallization techniques in that the crystallization promoting element remains in the crystalline silicon film. This type of crystallization promoting element is one that will harm the semiconductor characteristics of the crystalline film, so that the stability and reliability of manufactured elements will be lost.

Therefore, in order to eliminate this problem, the applicant of the present invention examined methods of eliminating (gettering) the crystallization promoting element from the crystalline silicon film. One method is to perform heat treatment in an atmosphere containing a halogen element such as chlorine. With this method, the crystallization promoting element within the film is vaporized as a halide.

A second method selectively dopes phosphorous into the crystalline silicon film and then performs heat treatment. The crystallization promoting element is allowed to move to the phosphorous doped regions by performing heat treatment, and is captured in these regions.

However, it is necessary to set heat treatment temperature at 800° C. or above to obtain a gettering effect in the first method, thereby being not capable of using a glass substrate. On the other hand, the heat temperature can be set to 600° C. or less in the second method, but there is a drawback in that the processing time requires well over 10 hours.

SUMMARY OF THE INVENTION

An object of the present invention is to provide a method of performing the removal process of a crystallization promoting element with good efficiency, in using the crystallization promoting element removal technique of the second method stated above.

In addition, another object of the present invention is to keep a processing temperature at 600° C. or less, thereby enabling the formation of high performance semiconductor elements on a glass substrate.

As shown in FIG. 2, the reason why it takes much period of time for removing crystallization promoting element is that a region 70 where the crystallization promoting element is to be reduced (hereinafter, referred to as a region to be gettered, for convenience) and phosphorous doped regions 71 for absorbing and capturing the elements (hereinafter, referred to as gettering regions) are separated from each other.

Therefore, if a gettering region is formed in contact with a region to be gettered, the migration distance to the region where the crystallization promoting element is to be captured, can be shortened, so that the process time for the removal of the crystallization promoting element can be shortened, and the process temperature can be lowered.

Here, the region 70 where the crystallization promoting element is to be reduced (the region to be gettered) is a region that includes the region that becomes the channel forming region, which provides the greatest influence regarding whether the semiconductor characteristics are good or poor. The switching characteristics and the mobility value change greatly in accordance with the characteristics of the channel forming region. If the crystallization promoting element remains irregularly in the channel forming region, this becomes a cause of damage to the semiconductor characteristics such as the switching characteristics and mobility, resulting in the lost of stability and reliability of the element. Therefore, the reduction of the crystallization promoting element remaining in the channel forming region is indispensable in the manufacture of stable and reliable elements.

Further, in addition to taking the region that becomes the channel forming region as the region to be gettered 70, it is desirable to include regions that become low impurity concentration regions that contact the channel forming region. The low impurity concentration regions are regions that reduce the leak current in the off state. Therefore, by reducing the crystallization promoting element which remains in the low impurity concentration regions, it is possible to obtain a stable, reliable element with respect to the reduction of the leak current.

Note that the low impurity concentration regions are high resistance regions in which the impurity concentration is less than that of the source region and the drain region. The impurity concentration is from $10^{16}$ to $10^{19}$ atoms/cm$^3$. However, the impurity concentration in the low impurity concentration regions does not necessarily have to be less than that of the source region and the drain region, provided that the resistance in the low impurity concentration regions is higher than that of the source region and the drain region. Therefore, it is acceptable to implant ions into the low impurity concentration regions or irradiate them with a laser, giving those regions higher resistance than that of the source region and the drain region, as a substitute for reducing the impurity concentration in the low impurity concentration regions. The impurity concentration in the low impurity concentration regions may also be the same as that in the source region and the drain region.

By considering that the gettering region for capturing the crystallization promoting element, contacts the region to be gettered, has a size at which it is possible to capture the crystallization promoting element included in the region to be gettered, and reduces the number of processes, then it is necessary that it must be a region that includes at least the region that becomes the source region and the region that becomes the drain region. By doping a group 15 element such as phosphorus into a region that includes the region that becomes the source region and the region that becomes the drain region, the introduction of an impurity element for lowering resistance into the region that becomes the source region, and into the region that becomes the drain region, can be performed at the same time, and the impurity element introduction processing can be reduced.

Therefore, as shown in FIGS. 1A to 1D, in the present invention, a group 15 element is doped into regions 83, shown with dashed lines, which include at least regions 81 that become source regions, and regions 82 that become drain regions. Regions 81 and 82 contact regions to be gettered 80 that include regions that become channel forming regions, or the regions that become channel forming regions and regions that become low impurity concentration regions. The crystallization promoting element inside the regions to be gettered 80 is allowed to move to the gettering regions 83, in the direction indicated by arrows 85, and are captured, removing the crystallization promoting element from the regions to be gettered 80. The above are the main constituents of the present invention.

In FIG. 1A, the regions 81 that become the source regions and the regions 82 that become the drain regions are taken as the gettering regions 83, a group 15 element is doped, and removal of the crystallization promoting element in the regions to be gettered 80 is performed. In FIG. 1A, an area of the gettering regions 83 for capturing the crystallization promoting element is the minimum necessary, so that the concentration of the crystallization promoting element captured in the gettering regions 83 can be increased, and a reduction in resistance of the source regions 81 and the drain regions 82 can be obtained.

Phosphorus is doped in a belt shape manner as shown in FIG. 1B, and it is not necessary to align the positions of the phosphorus doping regions 83 with island-like semiconductor layers 86 in the horizontal direction (the belt length direction). In addition, the area of the gettering regions 83 in FIG. 1B is larger than that of FIG. 1A, so that the removal time for the crystallization promoting element can be shortened, and that the temperature can be lowered. At the same time, the belt widths of the phosphorus doping regions 83 in FIG. 1B are set to the widths of the source regions 81 and the drain regions 82, and the phosphorus doping regions 83 are made belt shape and their areas are the minimum required, so that out of all shapes that do not need to be aligned in the horizontal direction, the concentration of the crystallization promoting element captured in the source regions 81 and the drain regions 82 can be made its highest. And the resistance in the source regions 81 and the drain regions 82 can be lowered.

FIG. 1C shows, as in FIG. 1B, that phosphorus is doped in a belt shape manner, and the same effects as in FIG. 1B may be obtained. The widths of the phosphorus doping regions 83 are not the widths of the regions 81 that become the source region and the regions 82 that become the drain region, as in FIG. 1B. The widths of the phosphorus doping regions 83 are wider, so that the period of time to remove the crystallization promoting element can be made shorter than that of FIG. 1B, and that the temperature can be made lower. Further, in addition to the fact that it is unnecessary to align the phosphorus doping regions 83 and the island shaped semiconductor layers 86 in the horizontal direction (the belt length direction) because the widths of the belt shaped regions are wider than the widths of the regions that become the source regions and the widths of the regions that become the drain regions, it is also not necessary to strictly perform alignment in the vertical direction (the belt width direction) for the phosphorus doping regions 83 and the island-like semiconductor layers 86. Therefore, the reliability can be maximized with FIG. 1C.

FIG. 1D shows that phosphorus is doped around regions 84 that become the channel forming regions (or into the regions that become the channel forming regions and the low impurity concentration regions). The crystallization promoting element removal time can be minimized, and the temperature minimized.

The main constituents of the present invention, in order to solve the above stated problems, include: a process A of forming a semiconductor film; a process B of introducing an element that promotes crystallization into the semiconductor film; a process C of crystallizing the semiconductor film after introducing the element that promotes crystallization; a process D of selectively doping a group 15 element into the crystallized semiconductor film; a process E of performing heat treatment the semiconductor film after doping the group 15 element; and a process F of patterning the semiconductor film to form an island-like semiconductor layer, wherein the patterning is performed so that the region into which the group 15 element is doped becomes a source region and a drain region, and the region into which the group 15 element is not doped becomes a channel forming region.

In the above semiconductor film formation process A, the semiconductor film is a non-crystalline semiconductor film, or a semiconductor film having crystallinity, but with almost no crystal grains on the order of 100 nm or greater, and specifically this indicates an amorphous semiconductor film or a microcrystalline semiconductor film. A microcrystalline semiconductor film is a multi-phase semiconductor film of microcrystals, with a grain size of from several nanometers to several tens of nanometers, and non-crystallinity.

More specifically, the semiconductor film is an amorphous silicon film, a microcrystalline silicon film, an amorphous germanium film, a microcrystalline germanium film, or amorphous $Si_1Ge_{1-x}$ (where $0<x<1$), and semiconductor films of these are deposited by chemical vapor deposition such as plasma CVD and reduced pressure CVD.

In addition, the semiconductor film and an inorganic insulating film may be deposited in succession when forming the semiconductor film. By doing so, impurities can be prevented from adhering to the surface of the semiconductor film. Further, the successively formed inorganic insulating film may be taken as a gate insulating film or a portion of a gate insulating film. Impurities at the interface of the semiconductor film and the gate insulating film are a cause of harm to the semiconductor characteristics, but if the semiconductor film and the gate insulator are deposited in succession, impurities can be prevented from adhering to the interface between the semiconductor film and the gate insulating film.

In the above introducing process B, the element that promotes crystallization (crystallization promoting element) is an element that has the function of promoting crystallization of a semiconductor, especially silicon. One or more elements selected from the following can be used as the crystallization promoting element: Ni; Fe; Co; Ru; Rh; Pd; Os; Ir; Pt; Cu; Au; and Ge.

A method of doping the crystallization promoting element into the semiconductor film, or a method of forming a film containing the crystallization promoting element on the upper surface or lower surface of the semiconductor film, can be used for a method of introducing the crystallization promoting element.

In the former method, after forming the semiconductor film, a method of doping the crystallization promoting element into the semiconductor film by ion injection or plasma doping can be used.

For the latter method, deposition techniques such as CVD, and sputtering, and coating techniques such as applying a solution that contains the crystallization promoting element by using a spinner, can be given for forming a film containing the crystallization promoting element. Further, when forming a film containing the crystallization promoting element, forming it either before or after the semiconductor film is good. If the semiconductor film is formed first, the film containing the crystallization promoting element is formed closely adhering to the upper surface of the semiconductor film. If the order of formation is reversed, the film containing the crystallization promoting element is formed closely adhering to the lower surface of the semiconductor film. Note that for the present invention, closely adhering does not always literally indicate that the semiconductor film and the crystallization promoting element are in close contact, but it includes compositions in which, if the crystallization promoting element can move within the semiconductor film, then an approximately 10 nm thick oxidized film, naturally oxidized film, etc., exist between the films.

For example, when nickel (Ni) is used as the crystallization promoting element in the introduction process, a Ni film or a Ni silicide film may be formed by a deposition technique.

Further, when using a coating technique, a solution can be used in which nickel bromide, nickel acetate, nickel oxalate, nickel carbonate, nickel chlorinate, nickel iodide, nickel nitrate, or nickel sulfate, etc., is the solute, and in which water, alcohol, acid, or ammonia is the solvent. Or, a solution can be used in which nickel element is the solute, and benzene, toluene, xylene, carbon tetrachloride, chloroform, or ether is the solvent. In addition, a material like an emulsion in which nickel is dispersed throughout a medium, even if nickel is not completely dissolved, may be used.

Further, a method of forming an oxide film containing nickel in which either nickel or a nickel compound is dispersed in a solution used for forming an oxide film is acceptable. OCD (Ohka Diffusion Source), by Tokyo Ohka kogyo Co., Ltd., can be used as this type of solution. A silicon oxide film can be easily formed when OCD solution is used by applying it to the formation surface and then firing at approximately 200° C. Other crystallization promoting element can be handled similarly.

The concentration of the crystallization promoting element in the semiconductor film can be most easily regulated with the coating technique as the crystallization promoting element introduction method, more so than by methods of depositing the film by doping or by sputtering a Ni film. The processing is also simplified.

The above crystallization process C is performed while the crystallization promoting element moves (diffuses) in the semiconductor film. If the semiconductor film in which the crystallization promoting element has been introduced is treated by heating, then the crystallization promoting element immediately diffuses within the semiconductor film. Then as the crystallization promoting element continues to diffuse, a catalytic action is produced in the amorphous state molecular chain, and the semiconductor film is crystallized.

The applicant of the present invention has disclosed information regarding the action that promotes crystallization in Japanese Patent Application Laid-open No. Hei 6-244103 and in Japanese Patent Application Laid-open No. Hei 6-244104. The silicon in contact with the crystallization promoting element combines with the crystallization promoting element, forming a silicide. It is understood that then the silicide and the amorphous state silicon compound react, and crystallization progresses. This is because the interatomic distance between the crystallization promoting element and the silicon is extremely close to the interatomic distance of single crystal silicon. The Ni-Si interatomic distance is the closest to the single crystal Si-Si interatomic distance, shorter by approximately 0.6%.

The following equation can be used to represent a model of the reaction that crystallizes the amorphous silicon film using Ni as the crystallization promoting element:

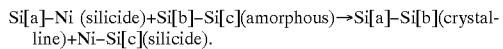

Note that in the above reaction equation, the indices [a], [b], and [c] represent Si atom locations.

The above reaction equation shows that Ni molecules in the silicide replace Si[b] atoms in the amorphous portion of the silicon, so that the Si[a]–Si[b] interatomic distance becomes almost the same as in a single crystal. In addition, it shows that Ni continues to diffuse within the semiconductor film, causing crystal growth. Further, it shows that at the time when the crystallization reaction is completed, Ni is in a compound state with Si and localizes at the final edge (or at the tip of the crystal growth). In short, Ni is in a irregular distribution within the film in a silicide state represented by $NiSi_x$ after crystallization. The existence of this silicide can be confirmed as holes by FPM processing of the film after crystallization.

FPM processing is a process that uses FPM, (an etchant of 50% HF and 50% $H_2O_2$ mixed 1:1), which can remove nickel silicide in a short amount of time. The existence of nickel silicide can be verified by whether or not etching holes are caused after etching for 30 seconds with FPM.

Holes were generated by FPM irregularly in the crystallized silicon film by FPM processing. This shows that nickel localizes in crystallized regions, and that a silicide is formed from a combination with silicon in the portions where Ni localizes.

Note that it is understood that heating may be performed in a furnace at 450° C. or above for imparting energy in order to advance the crystallization reaction. In addition, the upper limit of the heating temperature is 650° C. This is so that the amorphous semiconductor film crystallization does not advance into the areas that do not react with the crystallization promoting element. If crystallization occurs in the areas that do not react with the crystallization promoting element, the crystal grains cannot become large because the crystallization promoting element cannot diffuse into those areas, and the grain size is also dispersed.

In addition, there are cases in which defects are included within the crystal grains in a semiconductor film crystallized by heat treatment, and there are also cases where amorphous areas remain. Then in order to crystallize those amorphous areas, and in order to eliminate defects within the grains, it is desirable to perform another heating process. The heating temperature is higher than during the crystallization heating process, specifically between 500 and 1,100° C., more desirable between 600 and 1,100° C. Note that the actual upper limit of the temperature is determined by the heat resistance of the substrate.

Note also that irradiation of excimer laser light can be substituted for heating in this process. However, as stated above, there is an unavoidable irradiation energy dispersion with an excimer laser, so that there is a fear that dispersions in crystallization of the amorphous areas will develop. Especially for cases in which there are dispersions, per film, in the distribution of amorphous areas, in one semiconductor device, not only will there be dispersions in characteristics between elements, but there is a fear that dispersions will develop in the characteristics between semiconductor devices.

For this reason it is desirable to always perform heat treatment after crystallization in cases where excimer laser light is irradiated, crystallizing amorphous areas and reducing defects. Therefore, it is important to perform heat treatment in order to improve crystallinity when using an excimer laser in the next photo annealing process.

In addition, RTA, in which infrared light that has peaks in a wavelength of 0.6 to 4 μm, more desirable between 0.8 and 1.4 μm, is irradiated for several tens to several hundreds of seconds, is known as a heating method similar to heat treatment in a furnace. The absorption coefficient for infrared light is high, so that the semiconductor film is heated to a temperature of from 800 to 1,100° C. in a short time by irradiation of infrared light. However, the RTA irradiation time is longer than that of the excimer laser light, and heat is easily absorbed by the substrate, it is necessary to be careful of the generation of warping in cases where a glass substrate is used.

An object of the present invention is to remove (getter) the crystallization promoting element that localizes within the crystallized semiconductor film. A group 15 element is used in the present invention in order to getter the crystallization promoting element. In this case, the group 15 elements are P, As, N, Sb, and Bi. The element with the highest gettering ability is P, with Sb next.

To remove the crystallization promoting element in the present invention, a group 15 element is selectively doped into the crystallized crystalline semiconductor film, forming a region containing the group 15 element. Then heat treatment is performed, the crystallization promoting element moves in the region containing the group 15 element, and is captured. Vapor phase methods such as plasma doping and ion injection can be given for the process D in which a group 15 element is doped into the crystalline semiconductor film, the same as the method for introducing the crystallization promoting element into the semiconductor film.

The region in which the group 15 element is doped (the gettering region) either does not include the region that becomes a channel forming region of the crystallized semiconductor film, or does not include the regions that become the channel forming region and a low impurity concentration region. The region in which the group 15 element is doped does include the region which contacts the region that becomes the channel forming region, or does include the regions which contact the region that becomes the channel forming region and the region that becomes the low impurity concentration region. Specifically, the regions including the regions that become the source region and the drain region. By doping a group 15 element into the region that becomes the source region and into the region that becomes the drain region, the introduction process of an impurity element that gives low resistance can be performed at the same time. Therefore the processing can be simplified.

It is desirable to use an inorganic insulating film such as silicon oxide film, silicon nitride film, and oxidized silicon nitride film, as a mask when doping the group 15 element.

If the size of the region into which the group 15 element is doped (the gettering region) is at least as large as the region that becomes the source region and the region that becomes the drain region, then it is sufficiently large enough in order to remove the crystallization promoting element. However, if the group 15 element doped region is large, then the processing time can be shortened and the temperature reduced, which is desirable. Therefore, the processing performed to pattern the semiconductor film and to form an island-like semiconductor layer after removal of the crystallization promoting element, means that the group 15 element doped region can be larger than the source region and the drain region, which is desirable.

The group 15 element concentration in the region doped with the group 15 element is set at 10 times the concentration of the crystallization promoting element remaining within the semiconductor film. The crystallization promoting element remains on the order of $10^{18}$ to $10^{20}$ atoms/cm$^3$ with the crystallization method of the present invention, so that the group 15 element concentration is set to $10^{19}$ to $10^{21}$ atoms/cm$^3$.

The removal (gettering) of the crystallization promoting element is performed by the heating process E. The crystallization promoting element migrates to the group 15 element doped region (the gettering region) by heat treatment, and is captured (gettered). The crystallization promoting element removal process can be seen as a process in which crystallization promoting element is sucked into (gettered into) the group 15 element doped region.

The heat treatment is performed before formation of gate electrodes and gate wiring (the gate electrodes and the gate wiring are often formed as a unit). The temperature must be raised to its highest point of all manufacturing processes for the semiconductor device when the semiconductor film is crystallized and when the crystallization promoting element is removed. Therefore, by forming the gate electrodes after completion of these processes, a conductive material that is not highly heat resistant can be used for the gate electrodes. The property demanded of the gate electrode material when a semiconductor device is in use is low resistance, but the property of the gate electrode material demanded during manufacture of a semiconductor device is heat resistance. Heat resistance is an important property required so that reliability of the semiconductor device is not harmed. Conductive materials with low heat resistance have not been able to be used as gate electrode materials, no matter how low their electrical resistance, but by using the present invention conductive materials without high heat resistance can be used to form the gate electrodes.

In addition, with the present invention it is desirable to irradiate the crystallized crystalline semiconductor film with laser light or strong light before the crystallization promoting element removal process, in order to lower the temperature of the removal process and to reduce the processing time. The crystallization promoting element, which is localized in the crystalline semiconductor film, can be made into a state in which it is easily moved by light irradiation (photo annealing).

This is because the crystallization promoting element is distributed within the semiconductor film in a state like the NiSi$_x$ bonded to semiconductor atoms, but the Ni—Si bond is cut by the photo annealing energy, resulting in the crystallization promoting element returning to its atomic state. Or, this is because the Ni—Si bond energy is lowered, so that the remaining crystallization promoting element reaches a state in which it can easily move within the crystalline semiconductor film.

The crystallization promoting element can be made to migrate by heating at 500° C. or greater because the energy necessary to move the crystallization promoting element can be reduced by the above photo annealing, and the processing time can be shortened. In addition, the gettering region is formed in an element forming region, so that it is not necessary to newly form the gettering region, and the possible element forming area can be expanded. Note that the maximum heating temperature for the crystallization promoting element removal process is the temperature at which the group 15 element included in the gettering region will not migrate, from 800 to 850° C.

Further, the portion irradiated by light in the photo annealing process may be the portion of the semiconductor film which becomes the semiconductor layer that constitutes the semiconductor elements, and at least includes the region (channel forming region) which forms the depletion layer of the semiconductor layer.

An excimer laser can be used as the light source used for photo annealing. For example, a KrF excimer laser (wavelength 248 nm), a XeCl excimer laser (wavelength 308 nm), a XeF excimer laser (wavelengths 351 and 353 nm), an ArF excimer laser (wavelength 193 nm), and a XeF excimer laser (wavelength 483 nm), etc., can be used. In addition, an ultraviolet lamp can be used, and an infrared lamp such as a xenon lamp or an arc lamp can be used. Pulse oscillator type excimer laser light can also be used.

The patterning in the island-like semiconductor layer forming process F is performed so that the region into which the group 15 element has been doped becomes the source region and the drain region, and so that the region into which the group 15 element is not doped becomes the channel forming region, or becomes the channel forming region and the low impurity concentration region.

Afterward, the gate electrodes are formed through a gate insulating film that is formed in contact with the semiconductor layer, and the semiconductor layers opposing the gate electrodes are taken as channel forming regions. The gate electrodes are formed, through the gate insulating film, on the region (region to be gettered) of the island-like semiconductor layer in which the group 15 element is not doped.

The source region and the gate region are not formed in a self-aligning manner matching the gate electrodes in the present invention. Therefore, by only changing the size of the gate electrodes, it is possible to make a structure in which the group 15 element doped region (the source region and the drain region) and the gate electrodes overlap, as seen from above, and it is possible to form the group 15 element doped region (the source region and the drain region) and the gate electrodes so that they almost touch, as seen from above. It is also possible to make a structure with a fixed distance gap between the group 15 element doped region (the source region and the drain region) and the gate electrodes, as seen from above.

Furthermore, after forming the group 15 element doped region (the source region and the drain region) and the gate electrodes with a gap of a fixed distance, in other words, after the gate electrodes are formed, through the gate insulating film, on a portion of the region into which the group 15 element is not doped (the region that becomes the channel forming region, out of the region that becomes the channel forming region and the low impurity concentration region), an impurity element can be doped using the gate electrodes as a mask, forming a low impurity concentration region between the source and drain regions, and the gate electrodes, as seen from above.

In addition, after forming the low impurity concentration region, a second conductive film is formed as a portion of the gate electrode on the first conductive film, previously formed as the gate electrode. Then, by patterning the second conductive film so that the low impurity concentration region and the second conductive film overlap, a gate overlapped LDD (GOLD) structure can be obtained, having a region in which the gate electrodes and the low impurity concentration region overlap. Degradation of a semiconductor device due to hot electron injection can be prevented with the GOLD structure. Additionally, a two layer gate electrode case is explained, but multi-layered structures with three or more layers may be used.

Thus by changing the size of the gate electrodes with the present invention, elements with differing structures can be manufactured. Therefore, different structures can easily be made on the same panel, for example a structure with matrix circuit and driver circuit elements. Similarly, an n-channel type TFT and a p-channel type TFT of the matrix circuit can easily be formed with differing structures.

It has been shown that by also doping a group 13 element, in addition to the group 15 element, into the region that captures the crystallization promoting element, the removal effect is better than that with the group 15 element alone. In this case the group 13 element concentration is from 1.3 to 2 times the concentration of the group 15 element. Group 13 elements are B, Al, Ga, In, and Ti.

A crystalline semiconductor region in which the crystallization promoting element concentration is reduced to below $5 \times 10^{17}$ atoms/cm$^3$ (desirably below $2 \times 10^{17}$ atoms/cm$^3$) can be obtained by the crystallization promoting element removal process of the present invention.

Note that, at present, the minimum detection limit for SIMS (secondary ion mass spectroscopy) is $2 \times 10^{17}$ atoms/cm$^3$, so that it is not possible to investigate concentrations lower than that. However, it is estimated that the crystallization promoting element is reduced at least to between $1 \times 10^{14}$ and $1 \times 10^{15}$ atoms/cm$^3$ by performing the removal process given in this specification.

BRIEF DESCRIPTION OF THE DRAWINGS

In the accompanying drawings:

FIGS. 1A to 1D are schematic diagrams of the removal of a crystallization promoting element;

DETAILED DESCRIPTION OF THE PREFERRED EMBODIMENTS

The embodiment modes of the present invention are explained using FIGS. 3A to 6C. Note that a group 15 element is an element that imparts n-type conductivity to a semiconductor, and that it is used in the embodiment modes of the present invention to make the region, which becomes the n-type source region and the drain region, into a gettering region.

Embodiment Mode 1

Figure 2:
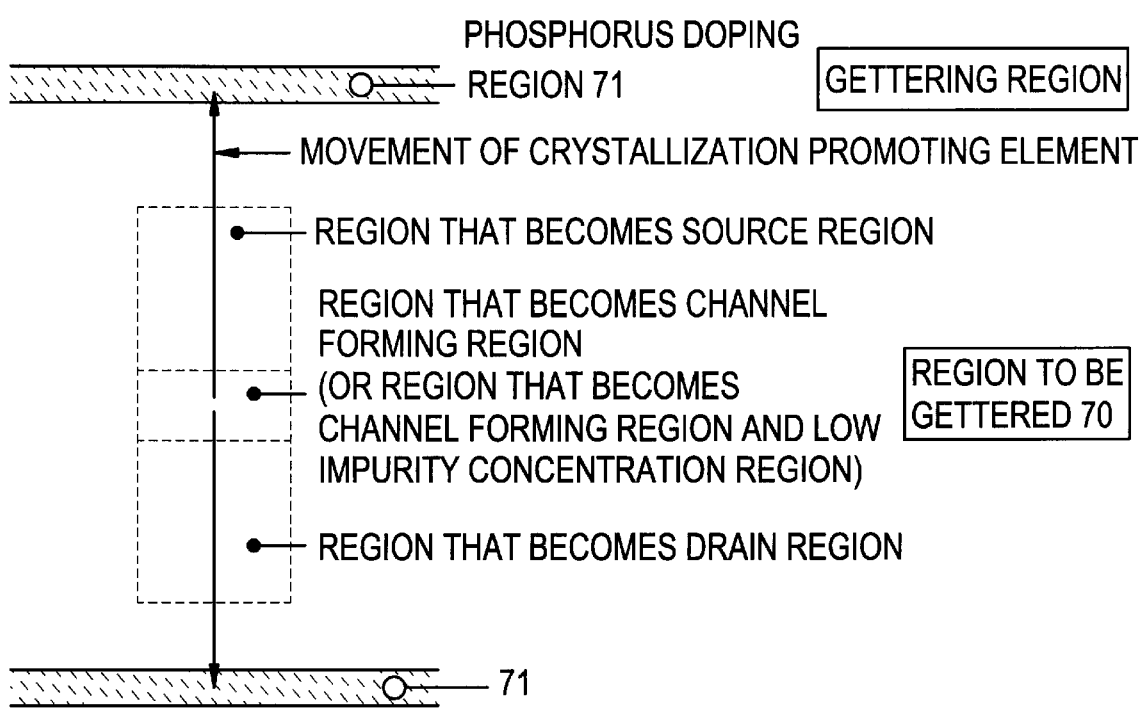
FIG. 2 is a schematic diagram of the conventional removal of a crystallization promoting element.
Figure 3A:
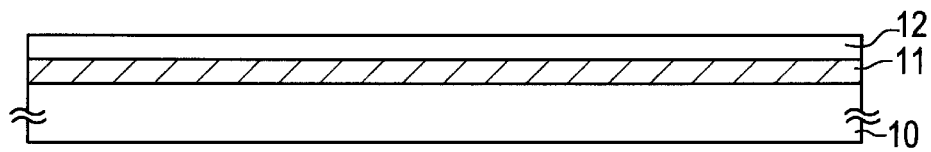
FIGS. 3A to 3F are cross sectional diagrams showing a manufacturing process of Embodiment Mode 1.
Figure 3B:
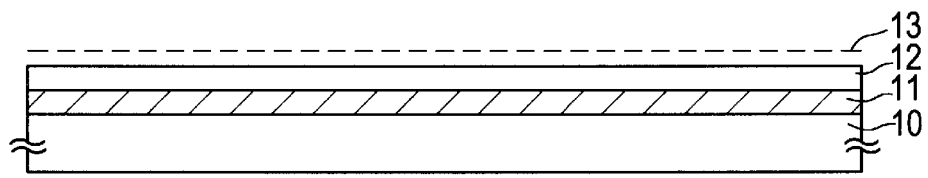
Figure 3C:
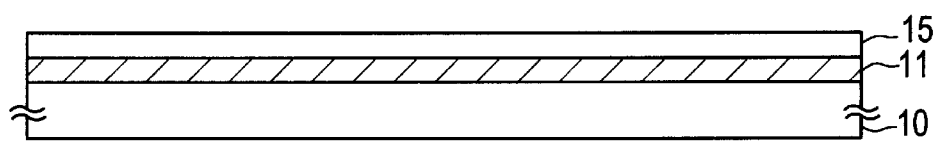
Figure 3D:
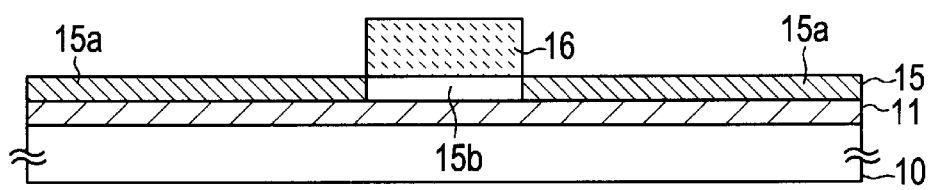
Figure 3E:
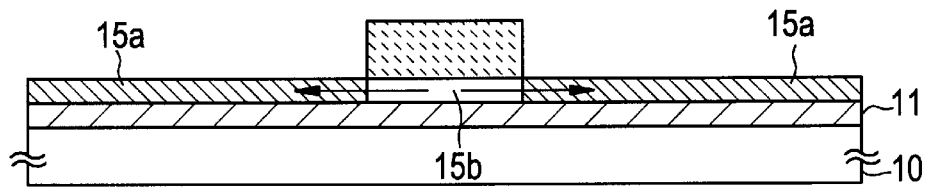
Figure 3F:
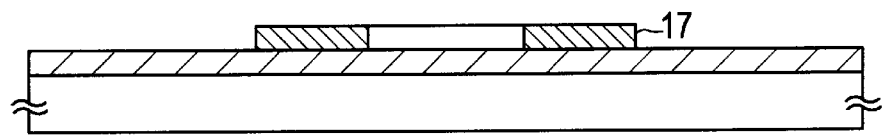
Figure 4A:
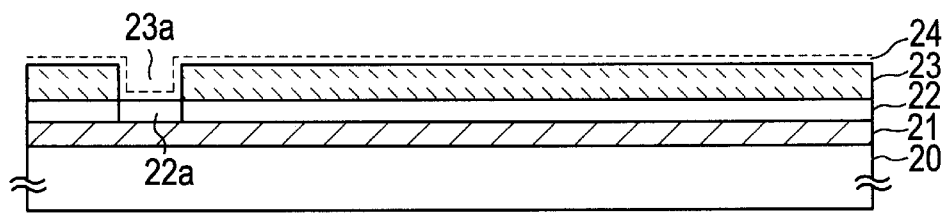
FIGS. 4A to 4E are cross sectional diagrams showing a manufacturing process of Embodiment Mode 2.
Figure 4B:
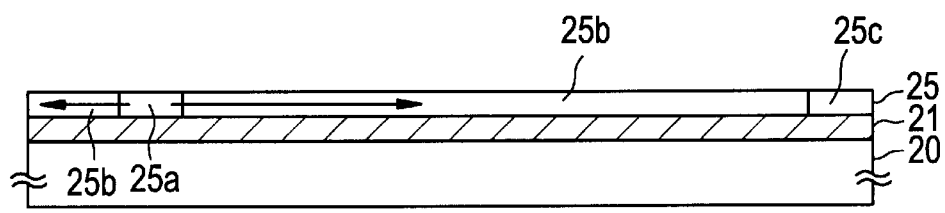
Figure 4C:
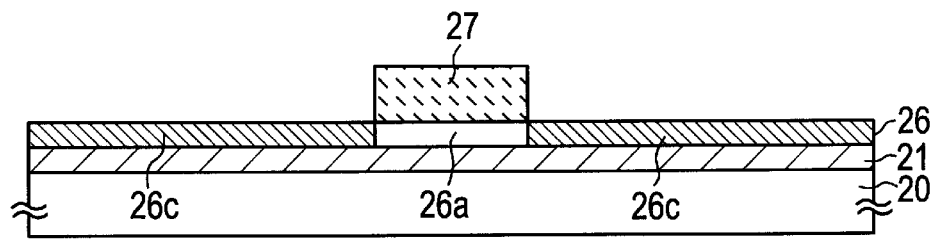
Figure 4D:
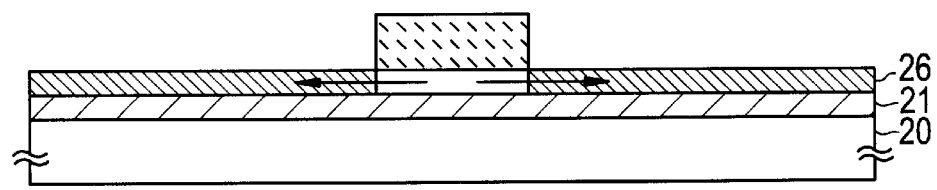
Figure 4E:
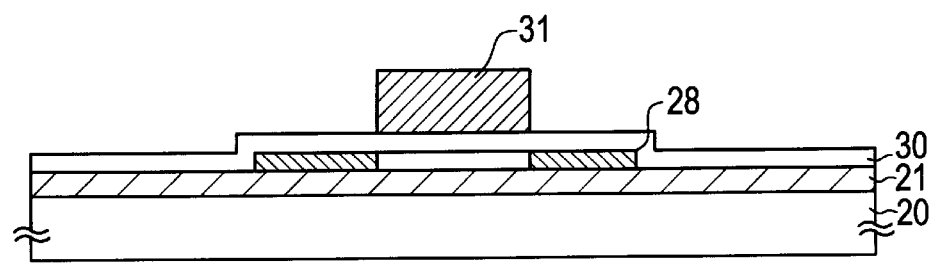

Embodiment Mode 1 is explained using FIGS. 3A to 3F. A substrate 10 is prepared as shown in FIG. 3A, and a base film 11 is formed on the surface of the substrate 10. Insulating substrates such as a glass substrate, a quartz substrate, a ceramic substrate, and a single crystal silicon substrate can be used as the substrate 10. In addition, conductive substrates such as a stainless steel substrate, and a Cu substrate, high melting point metallic materials such as Ta, W, Mo, Ti, and Cr, or alloys (for example, nitrogen alloys) of these, can be used as the substrate 10.

The base film 11 functions to prevent the diffusion of impurities from the substrate into a semiconductor device, to increase the adhesion of the semiconductor films and metallic films formed on the substrate 10, and to prevent peeling. An inorganic insulating film such as a silicon oxide film, a silicon nitride film, an oxidized silicon nitride film, etc., deposited by CVD, etc., can be used as the base film 11. For example, when a silicon substrate is used, the surface can be oxidized by thermal oxidation, forming a base film. In addition, if a heat resistant substrate such as a quartz substrate or a stainless steel substrate is used, an amorphous silicon film may be formed, and the silicon film may be thermally oxidized.

Furthermore, a laminate film may be used, a high melting point metallic film, such as tungsten, chrome, tantalum or a film having high conductivity, such as aluminum nitrite, may be used as a lower layer, and the above inorganic insulating film laminated as an upper layer. In this case the heat generated by the semiconductor device is emitted from the lower layer film of the base film 11, so that the operation of the semiconductor device can be stabilized.

A semiconductor film 12 is deposited on the base film 11 by a vapor phase method such as plasma CVD, reduced pressure CVD, and thermal CVD. An amorphous silicon film is deposited to a thickness of between 10 and 150 nm here by reduced pressure CVD. Plasma CVD has superior productivity than reduced pressure CVD, and reduced pressure CVD deposition takes time, but it has the advantage of being able to produce a finer film than that produced by plasma CVD. (See FIG. 3A.)

A crystallization promoting element is next introduced to the semiconductor film 12. A method of forming a film 13, which contains a crystallization promoting element, on the surface of the semiconductor film 12 is used here. For example, a nickel acetate salt solution is applied by a spinner, and is maintained in that state for several minutes. By drying with the spinner, a nickel film is formed as the film 13. In practice, the nickel concentration of the solution is 1 ppm or greater, desirably 10 ppm or greater. Note that the nickel film need not always be limited to a film state, and can be used even if not in a film state. (See FIG. 3B.)

The semiconductor film 12 into which the crystallization promoting element has been introduced is then treated by heating (thermally treated) in a furnace, forming a crystalline semiconductor film 15. The heat treatment conditions are at a temperature of from 450 to 650° C., desirably between 500 and 650° C., for 4 to 24 hours in an inert nitrogen atmosphere. Nickel elements are in contact with the entire surface of the semiconductor film in Embodiment Mode 1, so that the nickel migration direction is from the surface of the semiconductor film 12 toward the base film 11. In other words, nickel moves in a nearly vertical direction, and crystallization advances in that direction. (See FIG. 3C.)

A group 15 element is next selectively doped into the region which includes the region that becomes the source region and the region that becomes the drain region of the crystalline semiconductor film 15. A mask insulating film 16 is first formed on the region including the region that becomes a channel forming region of the semiconductor film 15, or the region that becomes the channel forming region and the region that becomes a low impurity concentration region. Resist, silicon oxide, etc., can be used as the mask insulating film 16, but an inorganic insulating film is desirable. A 100 nm thick silicon oxide film is deposited here, then patterned to form the mask insulating film 16. A group 15 element is then selectively doped by plasma doping, coating, etc., forming group 15 element doped regions 15a. The region into which the group 15 element is not doped is called a region to be gettered 15b, for convenience. (See FIG. 3D.)

The concentration of the group 15 element in the group 15 element doped region 15a is ten times that of the crystallization promoting element concentration in the region to be gettered 15b. The crystallization promoting element remains on the order of $10^{19}$ to $10^{20}$ atoms/cm$^3$ by using the method of Embodiment Mode 1, so that the group 15 element concentration is between $1\times10^{20}$ and $1\times10^{21}$ atoms/cm$^3$ in the group 15 element doped regions 15a.

Heat treatment is performed next at 500 to 850° C., more desirably between 550 and 650° C., for 4 to 8 hours. The crystallization promoting element remaining in the region to be gettered 15b is thus made to move to the group 15 element doped regions 15a, which include the region that becomes the source region and the region that becomes the drain region, where it is absorbed. The crystallization promoting element that reaches the regions that become the source region and the region that becomes the drain region bonds with the group 15 element. For example, if the crystallization promoting element is Ni and the group 15 element is P, then $NiP_1$, $NiP_2Ni_2$, etc., remain in a bonded state in the regions that become the source region and the region that becomes the drain region. The bonded state is extremely stable, and has almost no influence on the operation of a TFT. (See FIG. 3E.)

The concentration of the crystallization promoting element (Ni) is reduced to $2\times10^{17}$ atoms/cm$^3$ or less in the region to be gettered 15b by the annealing process. In addition, the group 15 element doped into the regions that become the source region and the region that becomes the drain region can be activated, lowering the resistance in the region that becomes the source region, and the region that becomes the drain region can be made.

After the crystallization promoting element removal process, the region 15 is patterned into an island shape so that either all of, or a portion of, the group 15 element doped regions 15a become the source region and the drain region, forming island-like semiconductor layers 17. A semiconductor device such as a TFT may then be manufactured using the island-like semiconductor layers 17.

The time required for the removal process can be shortened by the present invention because, before the crystallization promoting element removal process, the group 15 element that removes the crystallization promoting element is doped into the regions that become the source region and the drain region, and which contact the region to be gettered.

The regions that become the source region and the drain region are used in the group 15 element doped gettering region in Embodiment Mode 1, namely, the group 15 element doped gettering region is formed in the element forming area, so that elements can be integrated.

Embodiment Mode 2

Embodiment Mode 2 is explained using FIGS. 4A to 4E. In Embodiment Mode 2 the catalyst introduction method is changed from that of Embodiment Mode 1. In addition, a method of forming a gate insulating film after formation of the semiconductor layer is shown. Other portions are the same as in Embodiment Mode 1.

The substrate of Embodiment Mode 1 is prepared, and a base film 21 is formed on the surface of a substrate 20. An amorphous silicon film is next formed by reduced pressure CVD as a semiconductor film 22. The film thickness of the amorphous silicon film is from 20 to 100 nm (desirable between 40 and 75 nm). A film thickness of 65 nm is deposited here. Note that plasma CVD may be used to form the amorphous silicon film provided that the film quality obtained is the same as that of the amorphous silicon film formed by reduced pressure CVD.

A mask insulating film 23 is formed on the amorphous silicon film, the semiconductor film 22. An opening 23a is formed in the mask insulating film 23 by patterning. The opening 23a prescribes the crystallization promoting element doping region. Resist and a silicon oxide film can be used as the mask insulating film 23. A 120 nm thick silicon oxide film is formed here.

A solution of nickel acetate salt, containing 5 to 10 ppm by weight Ni, dissolved in ethanol is next applied by spin coating and dried, forming a Ni film as a crystallization promoting element containing film 24 on the mask insulating film 23. In this state, the nickel contacts the semiconductor film 22 in the opening 23a formed in the mask insulating film 23. (See FIG. 4A.)

After dehydrogenation for approximately one hour in a furnace at 450° C., heat treatment is performed within the furnace for 4 to 24 hours at between 450 and 650° C. in an inactive atmosphere or in a hydrogen atmosphere or in an oxygen atmosphere in order to make the nickel move from a nickel doped region 22a into the semiconductor film 22. Nickel moves within the semiconductor film 22 in the direction schematically shown by the arrows, and crystallization is performed. Heat treatment is performed here at 570° C. for 8 hours, forming a crystalline semiconductor film 25 that contains nickel. (See FIG. 4B.)

This process proceeds preferentially from a nickel silicide that reacts in the nickel doped region 22a, and a crystalline region (called a horizontal growth region) 25b grows nearly parallel to the surface of the substrate 20. The individual crystal grains of the horizontal growth region (the lateral growth region) 25b are gathered in a relatively aligned state, so that there is the advantage of superior crystallinity. Note that a region 25a is a region into which the crystallization promoting element is introduced, and is crystallized, but the crystallization promoting element remains at a high concentration and therefore the region 25a is not suitable for elements. Further, an amorphous region 25c is a region into which the crystallization promoting element does not move, and is a region into which crystallization does not advance. Therefore, only the horizontal growth region 25b is suitable for forming high performance elements.

Observation by TEM (transmission electron microscopy) shows that the crystal grains of the horizontal growth region 25b in the crystalline semiconductor film have a cylindrical or flattened cylindrical shape, and that the crystal grain orientations are almost in alignment. Nearly all of the crystal grains have a {110} orientation, with the <100> and <111> axes identical between each crystal grain, and the <110> axis varying by approximately 2°. Thus the bonding between atoms in the crystal grain boundaries is smooth, and there are only few unbonded sites because the crystal axis orientation is lined up in the horizontal growth region 25b.

On the other hand, many atoms exist which cannot bond in the grain boundaries of a conventional polycrystalline silicon, because the crystal axis directions are irregular for each grain. The crystal structures of the horizontal growth region 25b and a conventional polycrystalline silicon film differ completely on this point. The bonding between most of the atoms in the crystal grain boundaries is uninterrupted, and two crystal grains join together with extremely good matching, so that the horizontal growth region 25b is a structure in which the crystal lattice is connected with continuity, and in which it is extremely difficult to make a trap state, which is caused by crystal defects, etc. in the crystal grain boundaries.

A mask insulating film 27 is formed next from a silicon oxide film, similar to Embodiment Mode 1. The horizontal growth region 25b is made to be included in a region to be gettered 26a, which is a region that becomes a channel forming region, or which becomes a channel forming region and a low impurity concentration region. Then P (phosphorus) is doped as the group 15 element, forming group 15 element doped regions 26c doped with a group 15 element. The concentration of nickel remaining in the horizontal growth region 25a is approximately one-tenth of that in Embodiment Mode 1, namely between $10^{18}$ and $10^{19}$ atoms/cm$^3$, so that the phosphorus concentration in the group 15 element doped regions 26c is set between $1\times10^{19}$ and $1\times10^{20}$ atoms/cm$^3$. (See FIG. 4C.)

Note that the group 15 element passes through films of the group 15 element doped regions 26c, and is also doped into the base film 21 and the substrate 20. Therefore, the group 15 element at high concentration is included, in specific areas only, of the base film 21 or the substrate 20. However, the group 15 element does not impart any bad influence on the TFT characteristics.

A heating process is then performed at between 500 and 850° C. for 2 to 24 hours after forming the group 15 element doped regions 26c, moving the crystallization promoting element contained within the region to be gettered 26a to the group 15 element doped regions 26c, where it is absorbed (the direction of movement is shown by arrows). Thus a horizontal growth region in which the crystallization promoting element is reduced to below $5\times10^{17}$ atoms/cm$^3$, to between $1\times10^{14}$ and $1\times10^{15}$ atoms/cm$^3$, can be obtained. (See FIG. 4D.)

After removal of the mask insulating film 27 when the crystallization promoting element removal process is completed, a region 26 is patterned into an island shape so that all of or portions of, the group 15 element doped regions 26c becomes a source region and a drain region, and so that the region to be gettered 26a becomes either the channel forming region, or the channel forming region and the low impurity concentration region, thus forming a semiconductor layer 28 with an island shape.

Next, an insulating film 30 is formed by plasma CVD or reduced pressure CVD. The insulating film 30 is an oxidized silicon nitride film that covers the semiconductor layer 28. The insulating film 30 comprises the gate insulating film, and is given a film thickness of 50 to 150 nm.

A gate electrode 31 is formed next on the insulating film 30. High melting point metals, such as phosphorus doped silicon, Al, Ta, W, Mo, Ti, and Cr, for example, can be used either singly or in alloys (examples include alloys of high melting point metals themselves, alloys of high melting point metals and nitrogen, etc.)

The semiconductor layer 28, the insulating film 30, and the gate electrode 31 obtained by the above process can be used in the manufacture of a TFT.

Embodiment Mode 3

Figure 5A:
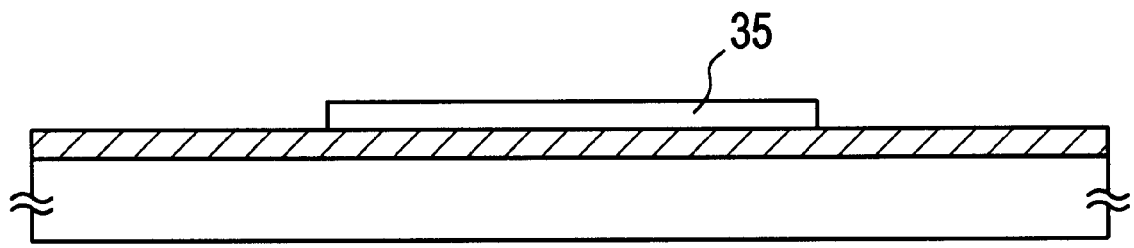
FIGS. 5A to 5C are cross sectional diagrams showing a manufacturing process of Embodiment Mode 3.
Figure 5B:
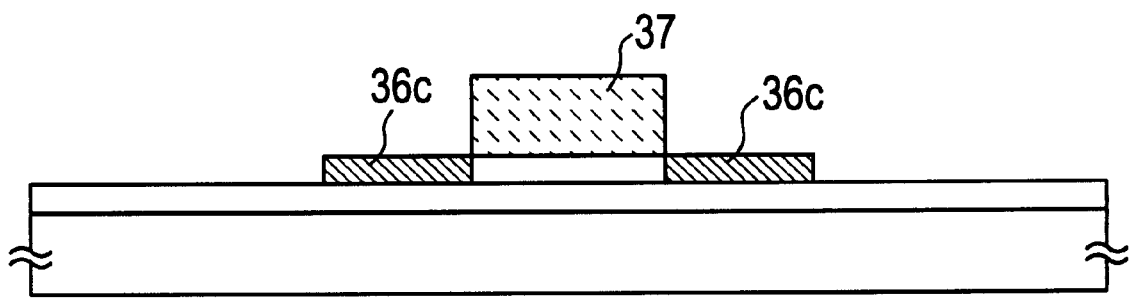
Figure 5C:
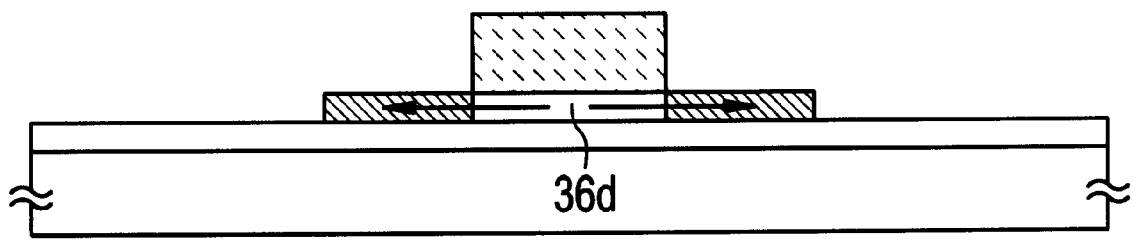

Embodiment Mode 3 is explained using FIGS. 5A to 5C.

The crystallization promoting element is removed after forming an island-like semiconductor layer (after patterning) in Embodiment Mode 3. Other portions are the same as in Embodiment Mode 1 or Embodiment Mode 2.

First, processing is performed in accordance with the processes explained in Embodiment Mode 1 or Embodiment Mode 2 through crystallization of the semiconductor film, and the crystalline semiconductor film obtained is then patterned, forming an island-like semiconductor layer 35. (See FIG. 5A.)

A mask insulating film 37 is formed next from a silicon. oxide film, the same as in Embodiment Modes 1 and 2. Then P (phosphorus) is doped as the group 15 element into the source region and the drain region, forming group 15 element doped regions 36c. (See FIG. 5B.)

Heat treatment is then performed at between 500 and 850° C. for 2 to 24 hours after forming the group 15 element doped regions 36c, moving the crystallization promoting element contained within a region to be gettered 36d to the group 15 element doped regions 36c, where it is absorbed (the direction of movement is shown by arrows). Thus a region in which the catalyst is reduced to below $5\times10^{17}$ atoms/cm$^3{}_1$ to between $1\times10^{14}$ and $1\times10^{15}$ atoms/cm$^3$, can be obtained. (See FIG. 5C.)

The semiconductor layer source region and drain region obtained by the above process have a high nickel element concentration, so that the source region and the drain region can be made lower resistance when compared to Embodiment Modes 1 and 2.

Embodiment Mode 4

Figure 6A:
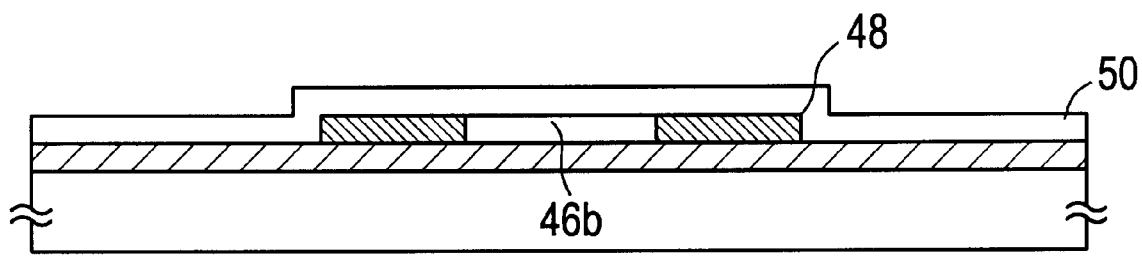
FIGS. 6A to 6C are cross sectional diagrams showing a manufacturing process of Embodiment Mode 4.
Figure 6B:
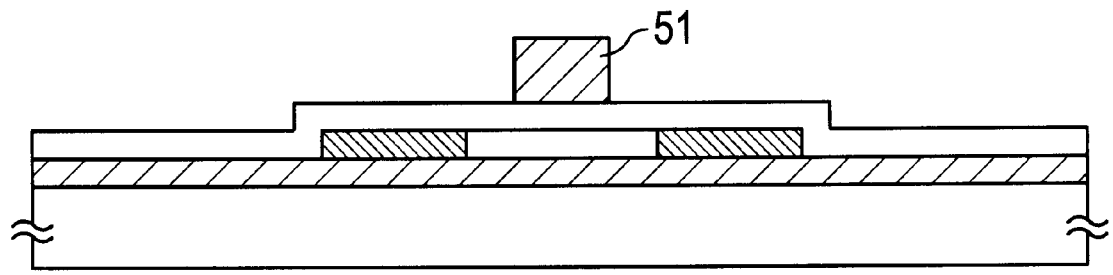
Figure 6C:
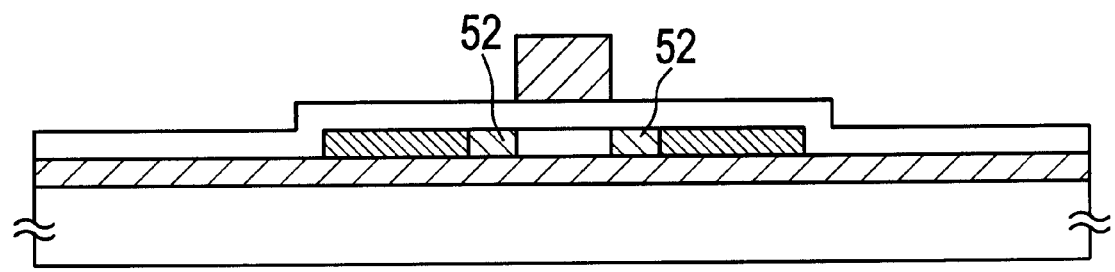

Embodiment Mode 4 is explained using FIGS. 6A to 6C.

With respect to formation of a low impurity concentration region, the region to be gettered is formed as the channel forming region and the low impurity concentration region in Embodiment Mode 4. It is possible to apply Embodiment Mode 4 to Embodiment Modes 1 to 3.

First, processing is performed in accordance with the processes of Embodiment Modes 1 to 3 until an island-like semiconductor layer 48, in which the crystallization promoting element in a region to be gettered 46d has been removed, is formed. A gate insulating film 50 is then formed on top. (See FIG. 6A.)

A gate electrode 51 is formed next. High melting point metals, such as phosphorus doped silicon, Al, Ta, W, Mo, Ti, and Cr, for example, can be used either singly or in alloys (examples include alloys of high melting point metals themselves, alloys of high melting point metals and nitrogen, etc.) The gate electrode 51 is formed on a portion of the region to be gettered 46d (from among the regions that become the channel forming region and the low impurity concentration region, on the area that becomes the channel forming region). (See FIG. 6B.)

Next, an impurity is doped using the gate electrode as a mask, forming a low impurity concentration region 52. Doping of the impurity is performed at a high acceleration level and a low dose amount, and phosphorus is doped into the semiconductor layer through the gate insulating film. The conditions are an acceleration voltage of 80 kV, and a set dose of $6 \times 10^{13}$ atoms/cm$^3$, giving a dose of $1 \times 10^{16}$ to $1 \times 10^{19}$ atoms/cm$^3$.

Thus the low impurity concentration region can be formed by the above processes without using a new mask.

Using Embodiment Mode 4, in addition, after formation of the low impurity concentration region, it is possible to form a second conductive film, as a portion of the gate electrode, on a first conductive film previously formed as the gate electrode. By patterning the second conductive film so that there is an overlap of the low impurity concentration region and the second conductive film, it is possible to obtain a gate overlapped LDD (GOLD) structure having a region in which the gate electrode and the low impurity concentration region overlap. The GOLD structure can prevent deterioration of the semiconductor device due to hot electron injection. Furthermore, a multi-layer structure in which the gate electrode has three or more layers, not two, may also be used.

Embodiments

The embodiments of the present invention are explained using FIGS. 7 to 16. Note that the Embodiment Modes 1 to 4 may be applied to the embodiments.

Embodiment 1

Embodiment 1 is an example in which the present invention is applied to a TFT, and shows an example of the manufacture of a CMOS circuit in which an n-channel type TFT and a p-channel type TFT are formed on the same substrate. FIGS. 7 to 9C are used for the explanation.

Figure 7:
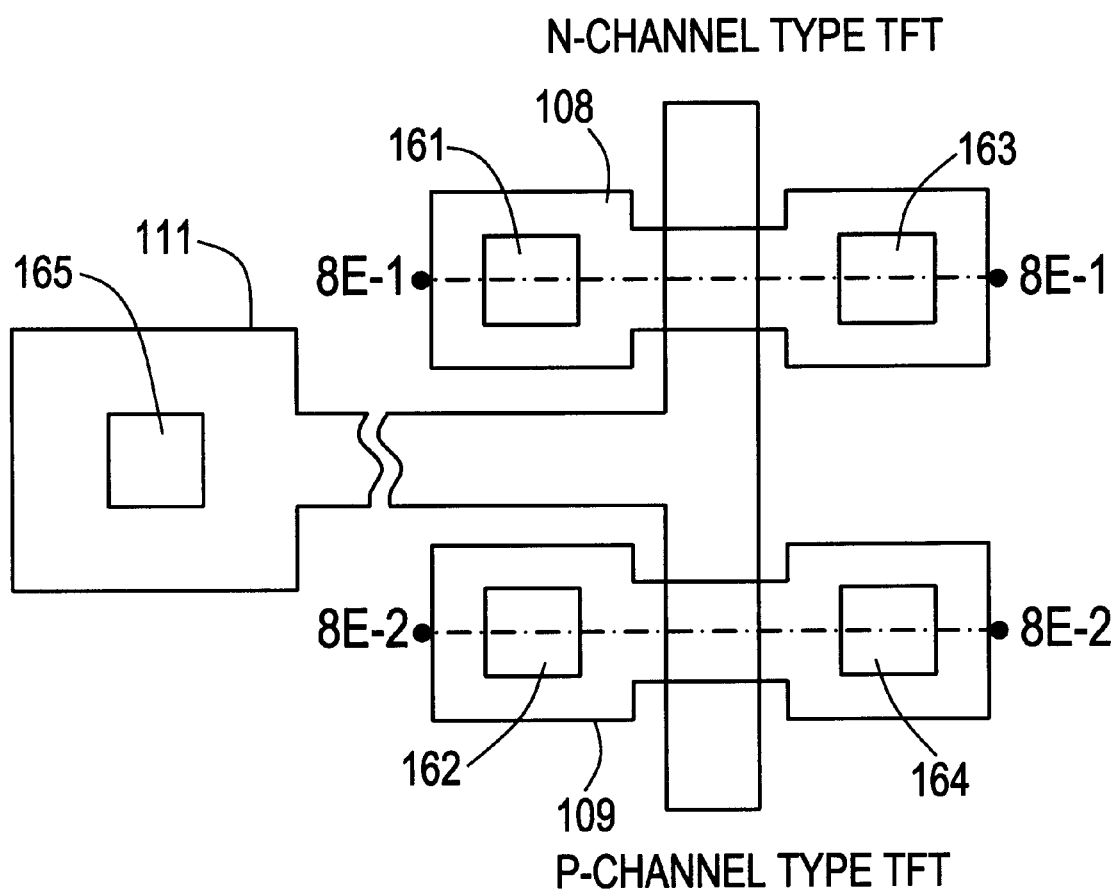
FIG. 7 is a planar diagram of a CMOS circuit of Embodiment 1.

FIG. 7 shows a schematic diagram of an upper surface of a CMOS circuit. In FIG. 7 reference numeral 111 denotes a gate wiring, reference numeral 108 denotes a semiconductor layer of an n-channel type TFT, and reference numeral 109 denotes a semiconductor layer of a p-channel type TFT. Reference numerals 161 and 162 denote contacts between the semiconductor layers 108 and 109 and source wirings, while reference numerals 163 and 164 denote contacts between the semiconductor layers 108 and 109 and drain wirings. Reference numeral 165 denotes a contact (gate contact) between the gate wiring 111 and an output wiring.

The TFT manufacturing process is explained using FIGS. 8A to 9C. Note that in FIGS. 8A to 9C, a cross sectional diagram of the n-channel type TFT is shown on the left side, and a cross sectional diagram of the p-channel type TFT is shown on the right side. The cross sectional diagrams of each of the TFTs correspond to sections cut along the dashed lines A–A' and B–B' in FIG. 7.

First, a Corning 1737 glass substrate is used as a glass substrate 100. A 300 nm thick silicon oxide film 101 is formed on the glass substrate 100 as a base film.

When the preparation of the substrate having insulating surface is completed, an amorphous silicon film 102 is formed as a semiconductor film by reduced pressure CVD with disilane as the raw material gas. The film thickness of the amorphous silicon film 102 is set to 55 nm. Next, a mask insulating film 103 is formed on the amorphous silicon film 102 from a 120 nm thick silicon oxide film. Openings 103a and 103b are formed in the mask insulating film 103 by patterning.

A solution of nickel acetate salt, containing 10 ppm by weight Ni, dissolved in ethanol is next applied by spin coating and dried, forming a Ni film 104. The Ni film 104 contacts the amorphous silicon film 102 in the openings 103a and 103b formed in the mask insulating film 103. Note that there is little permeation of the amorphous silicon-film 102, so that if an oxidized film of several nm in thickness is formed by UV radiation before forming the mask insulating film 103, then it becomes easy to form the Ni film 104 in a state in contact with the openings 103a and 103b. (See FIG. 8A.)

Figure 8A:
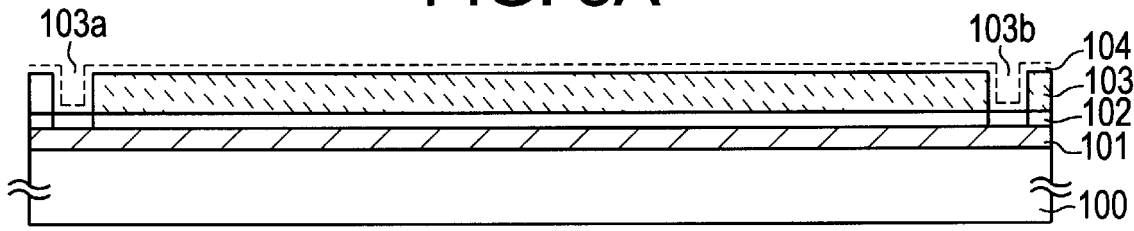
FIGS. 8A to 8E are cross sectional diagrams showing a manufacturing process of a TFT of Embodiment 1.
Figure 8B:
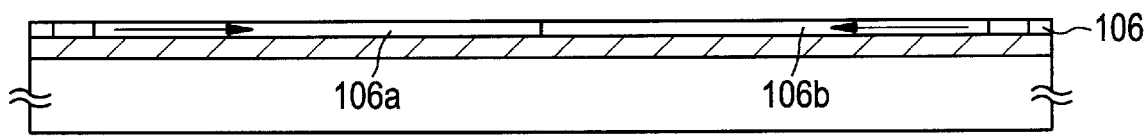
Figure 8C:
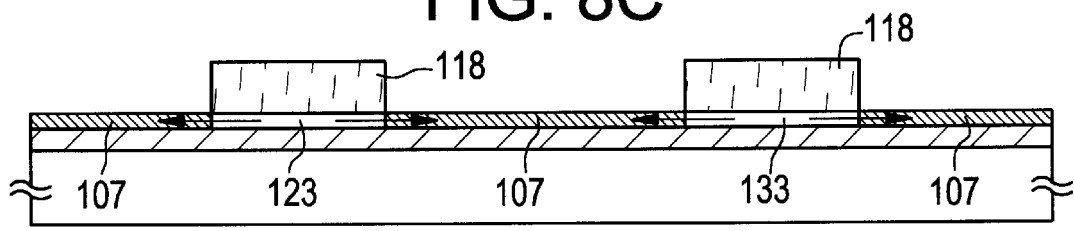
Figure 8D:
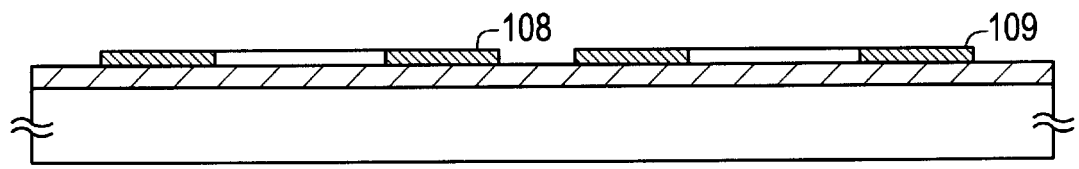
Figure 8E:
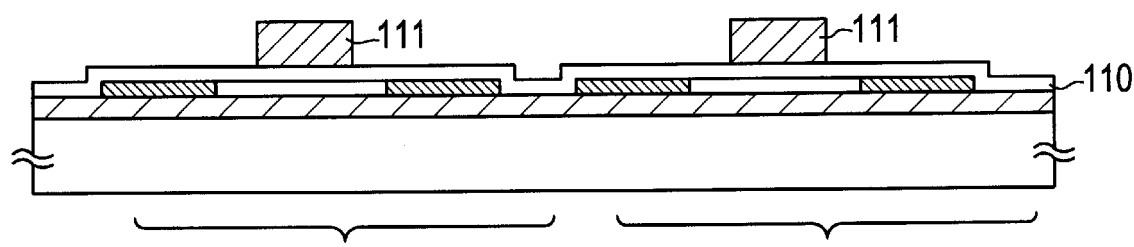
Figure 9A:
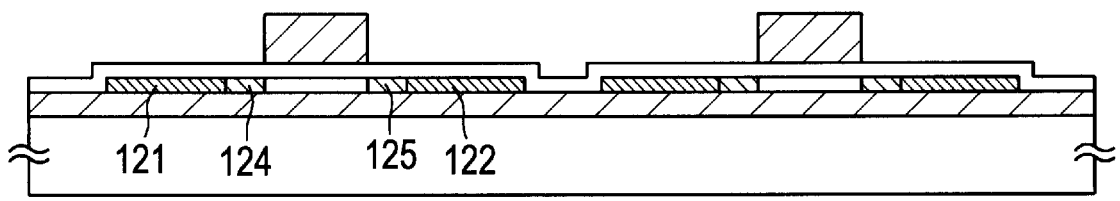
FIGS. 9A to 9C are cross sectional diagrams showing the manufacturing process of the TFT of Embodiment 1.
Figure 9B:
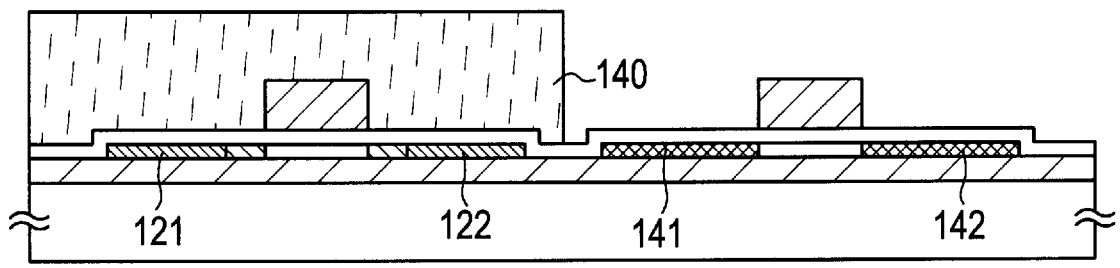
Figure 9C:
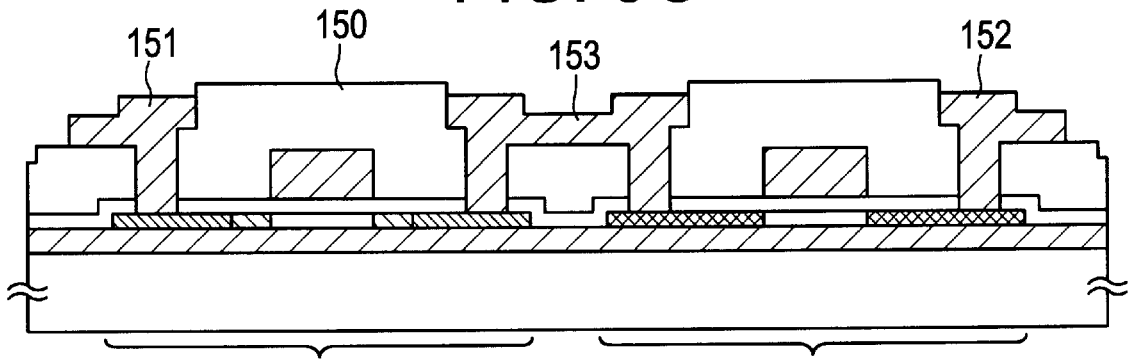
Figure 10A:
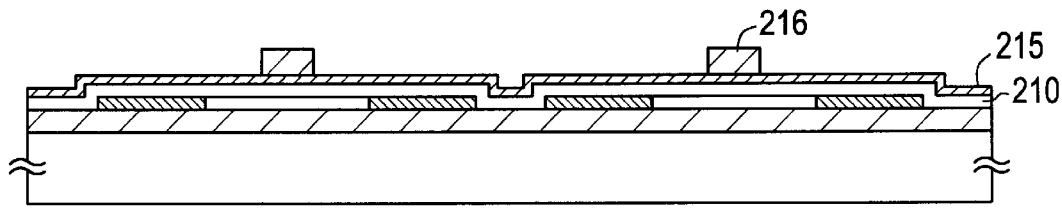
FIGS. 10A to 10E are cross sectional diagrams showing a manufacturing process of a TFT of Embodiment 2.
Figure 10B:
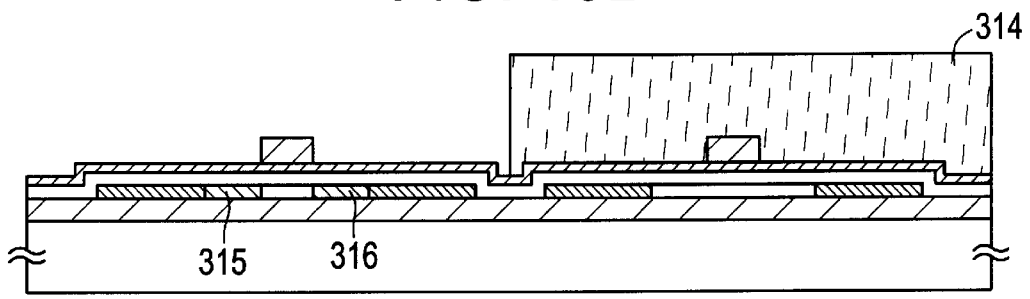
Figure 10C:
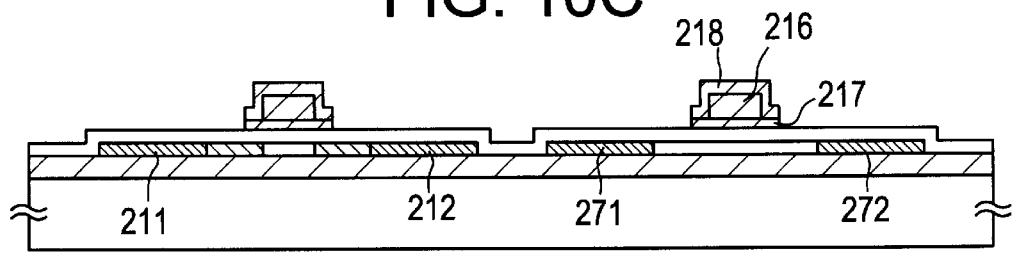
Figure 10D:
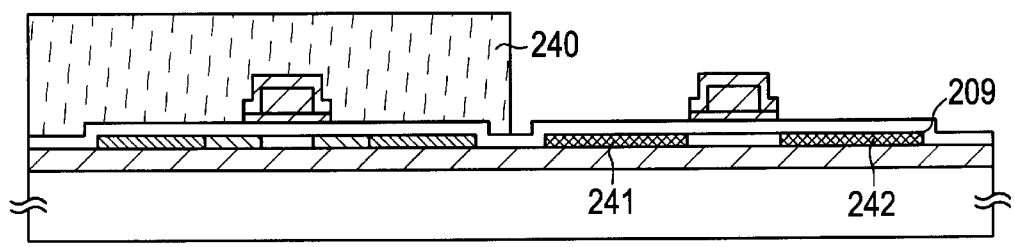
Figure 10E:
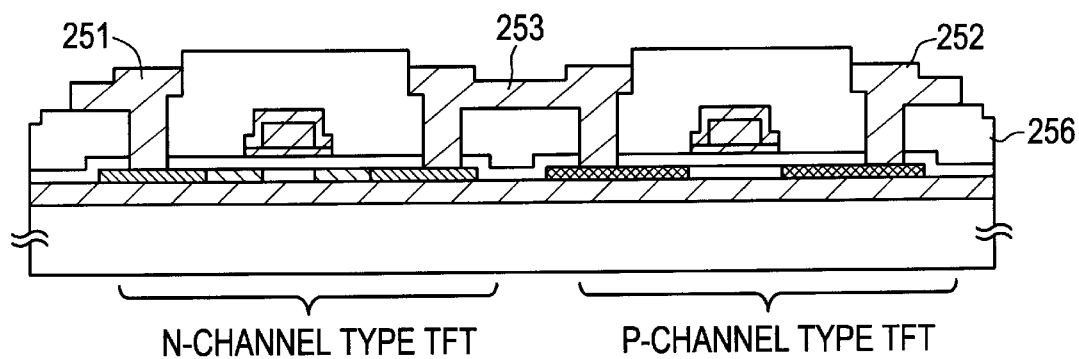
Figure 11A:
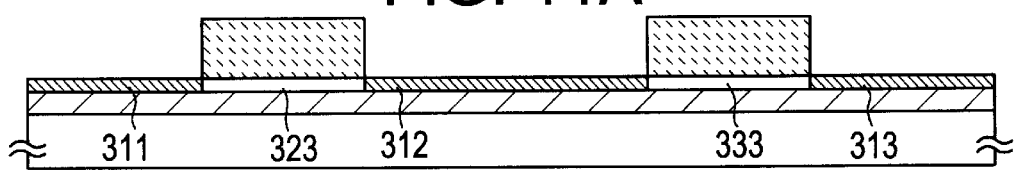
FIGS. 11A to 11F are cross sectional diagrams showing a manufacturing process of a TFT of Embodiment 3.
Figure 11B:
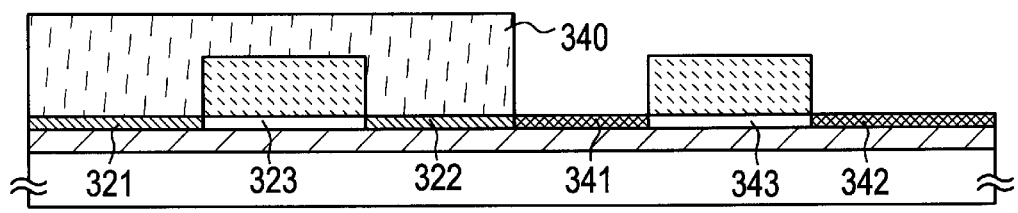
Figure 11C:
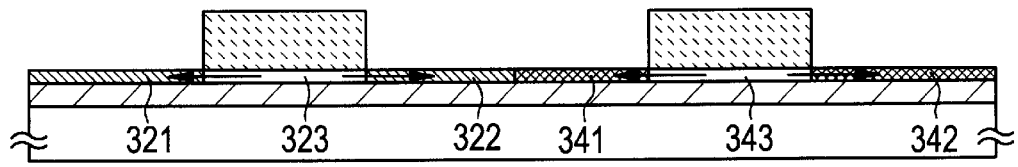
Figure 11D:
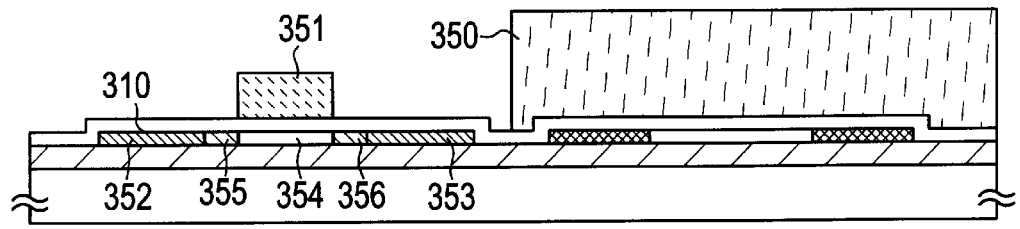
Figure 11E:
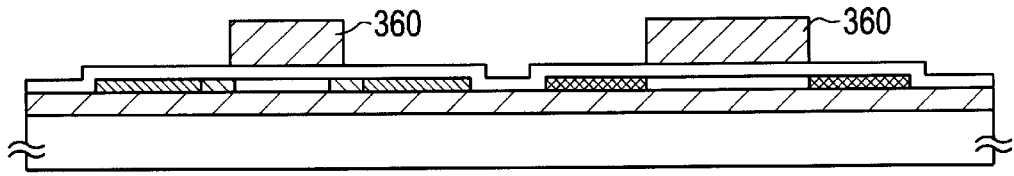
Figure 11F:
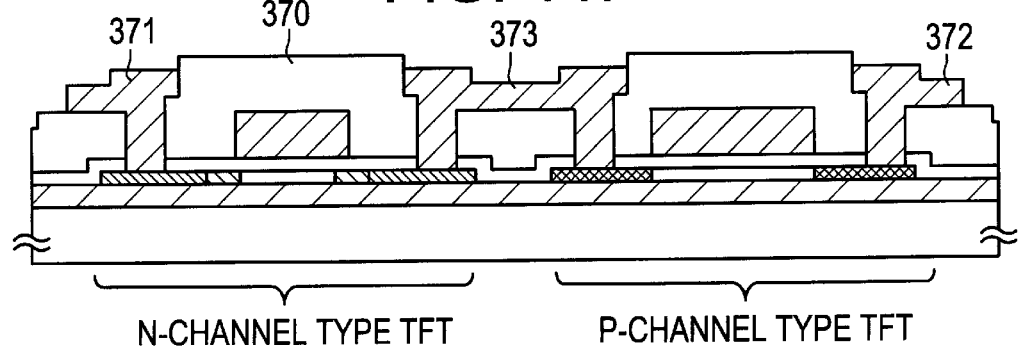

After thus obtaining the state of FIG. 8A, heat treatment is performed in a furnace for approximately one hour at 450° C. After dehydrogenation of the amorphous silicon film 102, heat treatment is performed in a furnace for 14 hours at 570° C. in a nitrogen atmosphere. Nickel moves from the Ni film 104 into the amorphous silicon film 102, and crystallization proceeds, forming a semiconductor film (crystalline silicon film) 106 having horizontal growth regions 106a and 106b. (See FIG. 8B.)

It is desirable to thermally treat the crystalline silicon film 106 for 1 to 4 hours at 600° C. after the crystallization process finishes, crystallizing amorphous areas and increasing the crystallinity. In addition, it is desirable to irradiate the crystalline silicon film 106 with KrF excimer laser light, making the Ni localized within the film into a readily movable state. The excimer laser light is processed by optics into line state laser light with a 0.5 mm width and a 12 cm length. By relatively scanning the substrate in a single direction relative to the line state laser light, the entire surface of the substrate is irradiated with the laser light. Or, the laser light can be processed into a rectangular shape with one edge of approximately 5 to 10 cm, and then irradiated.

A mask insulating film 118 is next formed on a gettering region, which includes a region that becomes a channel forming region, or that becomes the channel forming region and a low impurity concentration region. A group 15 element is doped into the semiconductor film, forming regions that become a source region and a drain region of the n channel type TFT. Phosphine diluted to 5% by hydrogen is used as the doping gas, and phosphorus is doped. Doping is performed at a low acceleration level and with a high dose amount. The doping conditions are set so that the P concentration is 10 times that of the concentration of Ni remaining in the semiconductor film 106. Doping is performed at an acceleration voltage of 80 kV and a set dose of $6\times10^{13}$ atoms/cm$^3$, making the dose amount between $1\times10^{19}$ and $1\times10^{22}$ atoms/cm$^3$. (See FIG. 8C.)

N$^+$ type regions 107 are formed in the semiconductor film 106. Portions of the n$^+$ type regions 107 in the semiconductor film 106 becomes the source and drain regions, and a region 123 becomes the channel forming region and the low impurity concentration region.

By heating in this state, the nickel in regions 123 and 133, which are not doped with phosphorus, can be absorbed by the n$^+$ type regions 107. The Ni, doped intentionally in order to crystallize the amorphous silicon film, moves from the regions 123 and 133, which include either the channel forming region or the channel forming region and the low impurity concentration region, to the region that includes the source region and the drain region, respectively, in the direction schematically shown by the arrows in FIG. 8C. As a result, the Ni in the region that becomes the channel forming region and the low impurity concentration region is reduced. On the other hand, the Ni concentration through the region used as the gettering region, and that becomes the source region and the drain region, becomes higher than that of the regions 123 and 133, the channel forming regions.

The crystalline silicon film 106 is next patterned into an island shape, forming the semiconductor layers 108 and 109. Note that the above excimer laser light irradiation may be performed after formation of the semiconductor layers 108 and 109.

Next, an oxidized silicon nitride film 110 is deposited to a thickness of 120 nm by plasma CVD using SiH$_4$ and N$_2$O as the raw material gasses. A 40 nm tantalum film (Ta film) is deposited by sputtering on the oxidized silicon nitride film 110 next, and then patterned, forming the gate electrodes 111. The gate electrodes are placed on a portion of the phosphorus undoped region (among the regions that become the channel forming region and the low impurity concentration region of the n-channel type TFT, the region that becomes the channel forming region). Note that the above excimer laser light irradiation may be performed before deposition of the Ta film. In Embodiment 1, at least the region that becomes the channel forming region is irradiated with laser light. (See FIG. 8E.)

An impurity is then doped using the gate wirings 111 as masks, forming low impurity concentration regions 124 and 125. Impurity doping is performed at a high acceleration level and low dose amount, and phosphorus is doped into the semiconductor layers through a gate insulating film. The conditions are an acceleration voltage of 80 kV, a set dose amount of $6\times10^{13}$ atoms/cm$^3$, giving a dose of $1\times10^{16}$ to $1\times10^{19}$ atoms/cm$^3$. (See FIG. 9A.)

A group 13 element B (boron) is next doped into the semiconductor layer 109 of the p-channel type TFT. After covering the n-channel type TFT with a resist mask 140, the semiconductor layer 109 is doped with B. Diborane diluted to 5% by hydrogen is used as the doping gas, and regions 141 and 142, which become p$^+$ type source and drain regions, are formed. (See FIG. 9B.)

The resist mask 140 is removed after forming the region that becomes the source region and the drain region, and heat treatment is performed in an electric furnace for two hours at between 350 and 550° C., at 450° C. in Embodiment 1. Phosphorus and boron doped into the source regions and drain regions 121, 122, 141, and 142, and the low impurity concentration regions 124 and 125 are activated by the heating process.

Next, an interlayer insulating film 150 made of a silicon oxide film is formed. After forming contact holes in the interlayer insulating film 150, a laminate film of titanium/aluminum/titanium is formed as an electrode material and patterned, forming wirings 151 to 153. The n-channel type TFT and the p-channel type TFT are connected here in Embodiment 1 by the wiring 153, forming a CMOS circuit. In addition, an output wiring (not-shown) for the gate wiring connected to the gate wirings 111 is formed. A final hydrogenation process, by which hydrogenation is performed for approximately two hours at 350° C. in a hydrogen atmosphere, is performed on the entire TFT. (See FIG. 9C.)

Embodiment 2

Embodiment 2 is explained using FIGS. 10A to 10E. Embodiment 2 is an example in which Embodiment 1 is modified and a GOLD structure is formed. The GOLD structure of Embodiment 2 may also be applied to Embodiment 1.

The same processes as in Embodiment 1 are performed through the formation of an island-like semiconductor region in which a crystallization promoting element has been reduced. A 20 nm thick silicon nitride film and a 100 nm thick oxidized silicon nitride film 210 are then formed as gate insulating films.

Next, the formation of gate electrodes and low impurity concentration regions is performed. A first conductive film 215 and a second conductive film 216 are formed on the surface of the oxidized silicon nitride film 210. The first conductive film 215 may be formed by a material selected from among Ti, Ta, W, and Mo, either singly or in an alloy. Further, while considering the electrical resistance and the heat resistance, a conductive material in which the main constituent is one of the above materials may also be used. It is necessary to make the thickness of the first conductive film 215 between 10 and 100 nm, desirably between 20 and 50 nm. A 50 nm thick Ti film is formed by sputtering here.

It is desirable to use a material selected from Al and Cu for the second conductive film 216. This is because it is formed in order to reduce the electrical resistance of the gate electrodes, and is formed to a thickness of 50 to 400 nm, desirably from 100 to 200 nm. When Al is used, either pure aluminum may be used, an aluminum alloy doped with 0.1 to 5 atom % of a material selected from among Ti, Si, and Sc. Further, it is desirable to form a silicon nitride film (not shown) on the surface of the gate insulating film 210 with a thickness of between 30 and 100 nm when copper is used.

An Al film doped with 0.5 atom % Sc is formed by sputtering to a thickness of 200 nm here. (See FIG. 10A.)

A resist mask 314 is then formed in the region that forms the p-channel type TFT, and a process is performed to dope a first impurity element that imparts n-type conductivity. Phosphorus (P), arsenic (As), and antimony (Sb), etc., are known as impurity elements that impart n-type conductivity, and phosphorus is used here. Ion doping is performed using phosphine (PH$_3$). Phosphorus is doped through the gate insulating film 210 and the first conductive film 215 to the semiconductor layer below, so that the acceleration voltage is set high at 80 keV. It is desirable for the concentration of phosphorus doped into the semiconductor layer to be in the range of from $1 \times 10^{16}$ to $1 \times 10^{19}$ atoms/cm$^3$, and is set to $1 \times 10^{18}$ atoms/cm$^3$ here. Thus regions 315 and 316, doped with a low concentration of phosphorus, are formed in the semiconductor layer. (See FIG. 10B.)

After then removing the resist mask 314, a third conductive film (not shown), is formed in close contact with the first conductive film 215 and the second conductive film 216. The third conductive film may be formed from a material selected from among Ti, Ta, W, and Mo. Further, while considering the electrical resistance and the heat resistance, a compound material with one of the above materials as the main constituent may also be used. For example, it is again necessary for the thickness of the third conductive film to be between 10 and 100 nm, desirably between 20 and 50 nm. A Ta film is formed here by sputtering to a thickness of 50 nm. Afterward, the first conductive film and the third conductive film are patterned at the same time, forming a first conducting layer 217 and a second conducting layer 218 with the same length in the channel length direction. (See FIG. 10C.)

The group 13 element B (boron) is next doped into the semiconductor layer 209 of the p-channel type TFT. After covering the n-channel type TFT with a resist mask 240, the semiconductor layer 209 is doped with B. Diborane diluted to 5% by hydrogen is used as the doping gas, and the regions 241 and 242, which become p$^+$ type source and drain regions, are formed. (See FIG. 10D.)

The resist mask 240 is removed after forming the source region and the drain region, and heat treatment is performed in an electric furnace for two hours at 450° C. Phosphorous and boron doped into the source regions and drain regions 211, 212, 241, and 242, and the low impurity concentration regions 315 and 316 are activated by the heating process.

Next, an interlayer insulating film 256 made from a silicon oxide film is formed. After forming contact holes in the interlayer insulating film 256, a laminate film of titanium/aluminum/titanium is formed as an electrode material and patterned, forming wirings 251 to 253. The n-channel type TFT and the p-channel type TFT are connected here in Embodiment 2 by the wiring 253, forming a CMOS circuit. In addition, output wiring (not shown) for the gate wiring connected to the gate wirings 111 is formed. A final hydrogenation process, by which hydrogenation is performed for approximately two hours at 350° C. in a hydrogen atmosphere, is performed on the entire TFT. (See FIG. 10E.)

Embodiment 3

Embodiment 3 is explained using FIGS. 11A to 11F. In Embodiment 3 a gate electrode is formed after activation processing, and reduced reliability due to inferior heat resistance of the gate electrode can be prevented even more than with Embodiment 1 and Embodiment 2. Embodiment 3 may be applied to Embodiment 1 or Embodiment 2.

The same processes as in Embodiment 1 are performed through doping of the group 15 element. By heating in this state, n$^+$ type regions 311, 312, and 313 can absorb the nickel in regions 323 and 333, into which phosphorus is not doped. In Embodiment 3, after doping a group 13 element B (boron) into the region that becomes the p-channel type TFT, a crystallization promoting element removal process is performed.

After covering the n-channel type TFT with a resist mask 340, B is doped into the semiconductor film that becomes the p-channel type TFT. Diborane diluted to 5% by hydrogen is used as the doping gas, and regions 341 and 342, which become p$^+$ type source and drain regions, and a region 343, which becomes a channel forming region, are formed. (See FIG. 11B.)

The boron ion concentration in the regions 341 and 342, the p-channel type source and drain regions, is set to approximately 1.3 to 2 times the phosphorus ion concentration doped into the corresponding regions in order to absorb the crystallization promoting element.

Heating treatment is performed for two hours at 500° C. in an electric furnace after doping the impurity element into the source region and the drain region. The Ni, intentionally doped for the crystallization of the amorphous silicon film, moves from the regions 323 and 343, regions to be gettered, to the regions 321, 322, 341, and 342, source regions and drain regions, by the heating process, as schematically shown by the arrows in FIG. 11C. As a result, the Ni within the regions 323 and 343, regions to be gettered, is reduced. On the other hand, the Ni concentration in the regions 321, 322, 341, and 342, the source regions and drain regions used in gettering, becomes higher than in the regions 323 and 343, the regions to be gettered. (See FIG. 11C.)

In addition, at the same time as gettering through the heating process, the phosphorus and boron doped into the regions 321, 322, 341, and 342, source regions and drain regions, are activated.

Next, an oxidized silicon nitride film 310 is deposited to a thickness of 120 nm by plasma CVD using SiH$_4$ and N$_2$O as the raw material gasses. The p-channel type TFT is covered with a resist mask or a mask insulator 350 on the oxidized silicon nitride film 310, and a resist mask or a mask insulator 351 is formed on the channel forming region of the n-channel type TFT. Then phosphorus is doped as the group 15 element. It is desirable that the concentration of phosphorus doped into the semiconductor layer be in the range of $1 \times 10^{16}$ to $1 \times 10^{19}$ atoms/cm$^3$, and is set to $1 \times 10^{18}$ atoms/cm$^3$ here. Thus low impurity concentration regions 355 and 356 of the n-channel type TFT are formed. (See FIG. 11D.)

It is desirable to perform heat treatment for two hours at 450° C. in an electric furnace afterward. The phosphorus and boron doped into the regions 321, 322, 341, and 342, source regions and drain regions, and into the low impurity concentration regions 355 and 356 are activated by the heating process.

A conductive film is deposited next, forming a gate wiring 360. Three layers are deposited by sputtering here, tantalum nitride (TaN$_x$)/tantalum (Ta)/tantalum nitride (TaN$_x$). The thickness of the TaN$_x$ films is 50 nm, and the thickness of the Ta film is 250 nm. The three layer film is then patterned, forming the gate wiring 360. The n-channel type TFT has a GOLD structure in Embodiment 3, and the p-channel type TFT has a structure without a low impurity concentration region. (See FIG. 11E.)

A silicon oxide film is formed next as an interlayer insulating film 370. After forming contact holes in the interlayer insulating film 370, a laminate film of titanium/aluminum/titanium is formed as at electrode material and patterned, forming wirings 371 to 373. The n-channel type TFT and the p-channel type TFT are connected here in Embodiment 3 by the wiring 373, forming a CMOS circuit. In addition, output wiring (not shown) for the gate wiring 360 is formed. A final hydrogenation process, by which hydrogenation is performed for approximately two hours at 350° C. in a hydrogen atmosphere, is performed on the entire TFT. (See FIG. 11F.)

Embodiment 4

In Embodiment 4 the TFT explained in Embodiment 1 is applied to an active matrix substrate. The active matrix substrate of Embodiment 4 can be used in flat type electro-optical devices such as liquid crystal display devices and EL display devices. Note that Embodiment 4 may be applied to Embodiment 2 or Embodiment 3.

Figure 12:
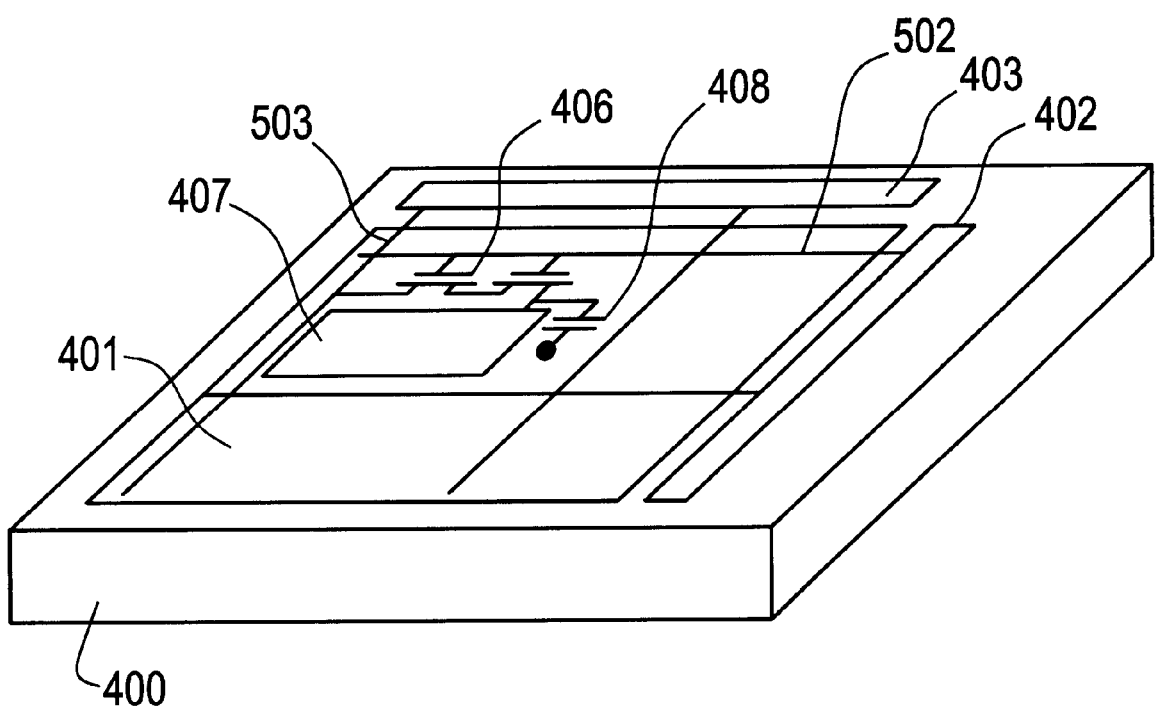
FIG. 12 is a perspective view of an active matrix substrate of Embodiment 4.
Figure 13A:
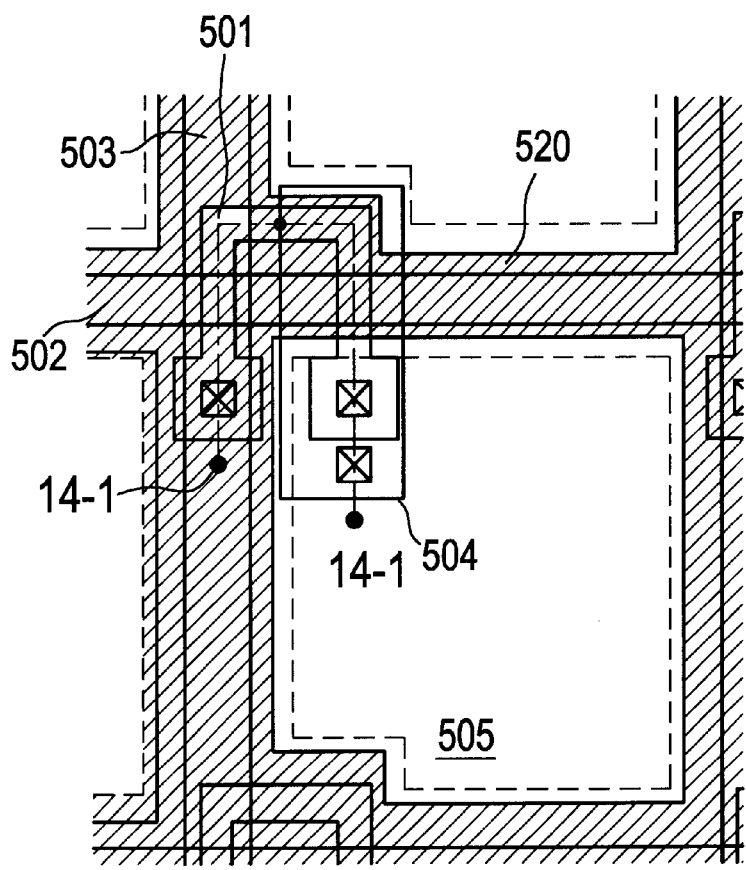
FIGS. 13A and 13B are top views of a pixel section and a CMOS circuit.
Figure 13B:
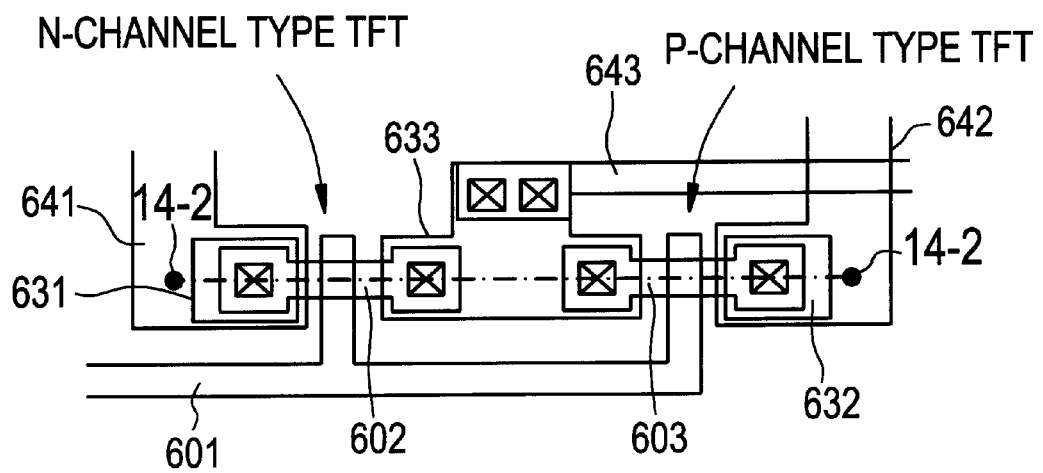
Figure 14:
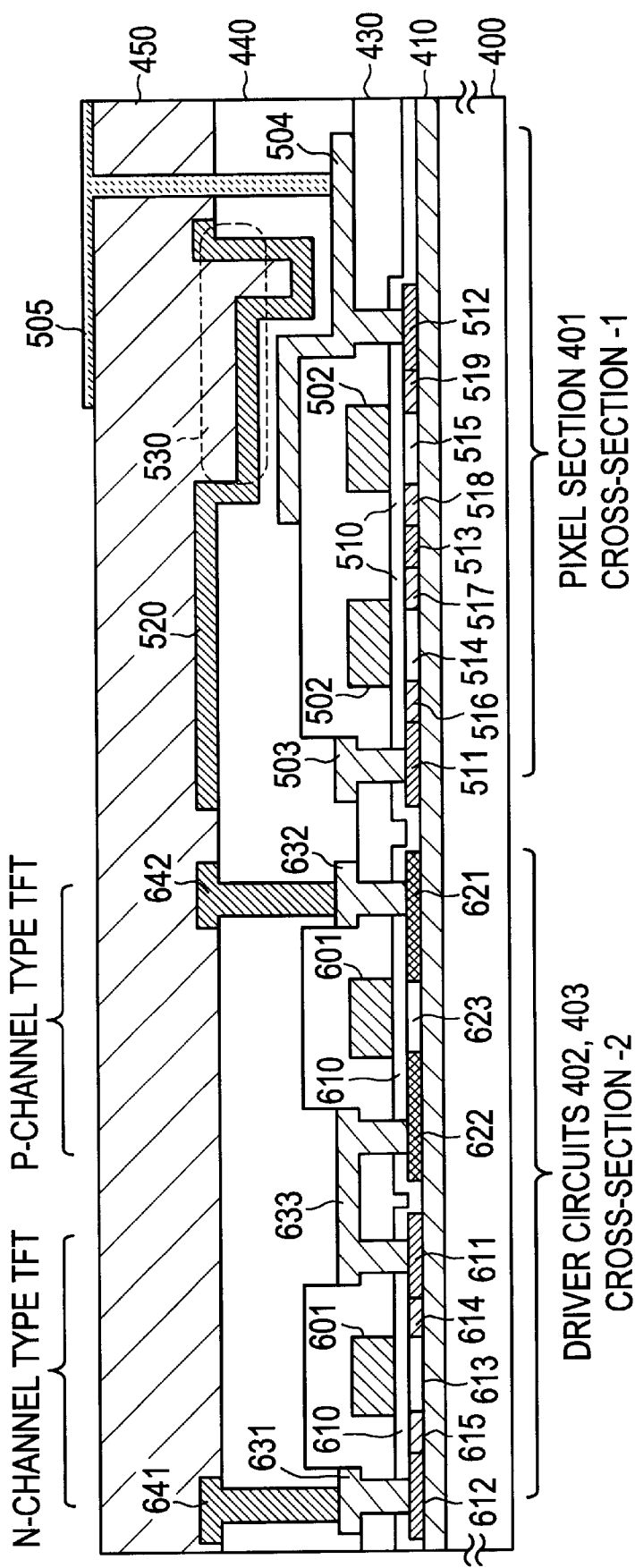
FIG. 14 is a cross sectional diagram of an active matrix substrate.

Embodiment 4 is explained using FIGS. 12 to 14. Identical symbols in FIGS. 12 to 14 show identical constituent elements. FIG. 12 is a schematic perspective view of an active matrix substrate. The active matrix substrate is structured by a pixel section 401, a scanning line driver circuit 402, and a signal line driver circuit 403 formed on a glass substrate 400. The scanning line driver circuit 402 and the signal line driver circuit 403 are connected to the pixel section 401 by scanning lines 502 and signal lines 503, respectively. The scanning line driver circuit 402 and the signal line driver circuit 403 are structured mainly with CMOS circuits.

The scanning line 502 is formed for each row of the pixel section 401, and the signal line 503 is formed for each column. Pixel TFTs 406, connected to each of the scanning lines 502 and the signal lines 503, are formed near the intersections of the scanning lines 502 and the signal lines 503. Pixel electrodes 407 and retention capacitors 408 are connected to the pixel TFTs 406.

The n-channel type TFTs and the p-channel type TFTs of the scanning line driver circuit 402 and the signal line driver circuit 403, and the pixel TFTs 406 of the pixel section 401, are first completed in accordance with the manufacturing processes of Embodiment 1.

FIG. 13A is a top view of the pixel section 401, a top view of approximately one pixel. FIG. 13B is a top view of a CMOS circuit structuring the scanning line and signal line driver circuits 402 and 403. FIG. 14 is a cross sectional diagram of an active matrix substrate, a cross sectional diagram of the pixel section 401, and a CMOS circuit. The pixel section 401 cross sectional diagram is a cross sectional diagram along the dashed line A–A' in FIG. 13A, while the CMOS circuit cross sectional diagram is a cross sectional diagram along the dashed line B–B' in FIG. 13B.

The pixel TFTs 406 of the pixel section 401 are n-channel type TFTs, and have a semiconductor layer 501 bent into a U-shape (horseshoe shape). The scanning line 502, which is a first layer wiring, sandwiches a gate insulating film 510 and intersects the semiconductor layer 501.

N$^+$ type regions 511 to 513, two channel forming regions 514 and 515, and low impurity concentration regions (n$^-$ type regions) 516 to 519 are formed in the semiconductor layers 501. The n$^+$ type regions 511 and 512 are source regions and drain regions.

On the other hand, in the CMOS circuit, one gate wiring 601 sandwiches a gate insulating film 610 and intersects two semiconductor layers 602 and 603. A source region 611 and a drain region (n$^+$ type region) 612, a channel forming region 613, and low impurity concentration regions (n$^-$ type regions) 614 and 615 are formed in the semiconductor layer 602. A source region 621 and a drain region (p$^+$ type region) 622, and a channel forming region 623 are formed in the semiconductor layer 603.

After forming the source regions and the drain regions in the semiconductor layers 501, 602, and 603, an interlayer insulating film 430 is formed over the entire substrate. A signal line 503, a drain electrode 504, source electrodes 631 and 632, and a drain electrode 633 are formed as second layer wirings and electrodes on the interlayer insulating film 430.

The scanning line 502 and the signal line 503 sandwich the interlayer insulating film 430, and intersect at right angles, as shown in FIG. 13A. The drain electrode 504 is an extraction electrode for connecting the n$^+$ type region (drain region) 512 with a pixel electrode 505, and at the same time is a lower electrode for the retention capacitor 408. In order to increase the capacity of the retention capacitor 408, the drain electrode 504 is made as large as possible without reducing the opening.

A first leveling film 440 is formed on the second layer wirings and electrodes. A laminate film of a silicon nitride film (50 nm)/a silicon oxide film (25 nm)/an acrylic film (1 μm) is used in Embodiment 4 as the first leveling film 440. Organic resin films such as acrylic, polyimide, and benzo-cyclobutane (BCB) are solution coating insulating films that can be formed by spin coating, so that it is possible to form a film thickness of approximately 1 μm with high throughput, and a good, level surface can be obtained. In addition, compared to a silicon nitride film and a silicon oxide film, an organic resin film has a low dielectric constant, so that the parasitic capacity can be made smaller.

Next, source wirings 641 and 642, drain wirings 643, and a black mask 520 are formed, as third layer wirings, on the first leveling film 440 from a light shielding conductive film such as titanium, and chromium. As shown in FIG. 13A, the black mask 520 is formed as a single body in the pixel section 401, to overlap the periphery of the pixel electrode 505, and to cover all areas not contributing to the display. Note that the black mask 520 is placed as shown by the dotted lines in FIG. 13A. Further, the electric potential of the black mask 520 is fixed at a predetermined value.

Before forming the third layer wirings 641, 642, 643, and 520, the first leveling film 440 is etched, forming a concavity 530 on the drain electrode 504, in which only the lowest layer silicon nitride film remains.

The drain electrode 504 and the black mask 520 sandwich the silicon nitride film only in the concavity 530 and are opposing, so that the retention capacitor 408 is formed in the concavity 530, with the drain electrode 504 and the black mask 520 as electrodes, and the silicon nitride film as a dielectric. Silicon nitride has a high specific dielectric constant, and moreover, by making the film thickness thin, a large capacity can be assured.

A second leveling film 450 is formed on the third layer wirings 641, 642, and 520. The second leveling film 450 is formed from a 1.5 μm thick acrylic. A large step develops in the area where the retention capacitor 408 is formed, but even that type of step can be sufficiently leveled.

Contact holes are formed in the first leveling film 440 and the second leveling film 450, and a pixel electrode 505 is formed from a transparent conductive film such as ITO, and tin oxide. Thus the active matrix substrate is completed.

When using the active matrix substrate of Embodiment 4 in a liquid crystal display device, an orientation film is formed (not shown), which covers the entire substrate. A rubbing process on the orientation film is performed when necessary.

Note that if a high reflectance conductive film is used as the pixel electrode 505, typically aluminum or a material with aluminum as its major constituent, then an active matrix substrate for a reflective type AMLCD can be manufactured.

In addition, the pixel TFT 406 has a double gate structure in Embodiment 4, but a single gate structure may be employed, as may a multi-gate structure such as a triple gate structure. Further, it may be formed with the inverse stagger type TFT shown in Embodiment 1. The structure of the active matrix substrate used in Embodiment 4 does not impose any limitations on the structure of Embodiment 4. The characteristics of the present invention are in the configuration of the gate wiring, and the user may determine the configurations of other portions as appropriate.

Embodiment 5

An example of the constitution of an active matrix type liquid crystal display device (denoted AMLCD) is explained in Embodiment 5 as an example of an electro-optical device using the active substrate shown in Embodiment 4.

Figure 15A:
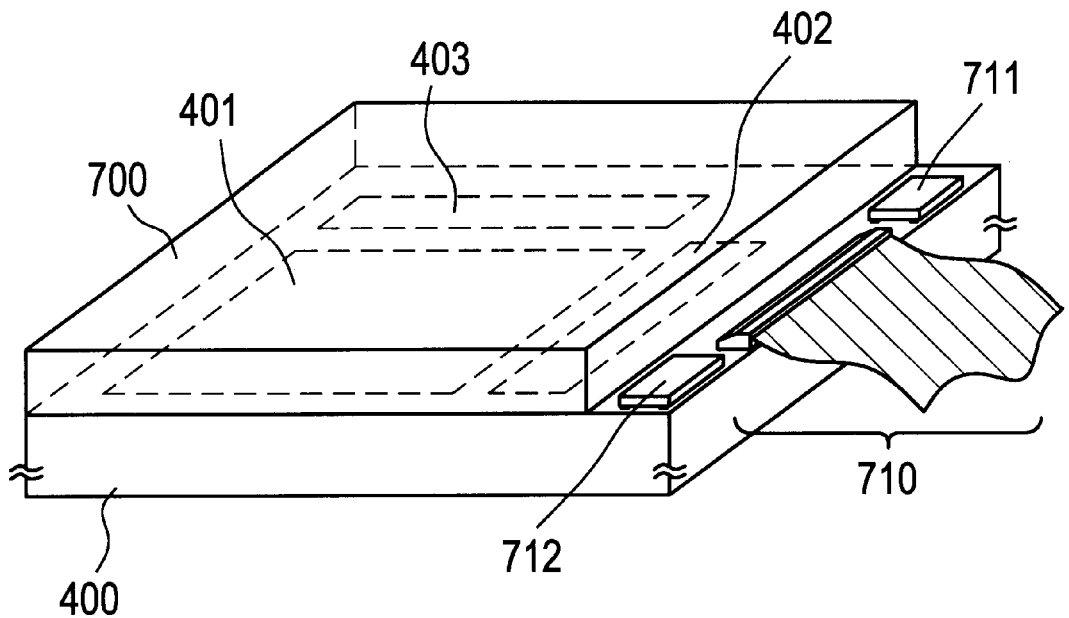
FIGS. 15A and 15B are external perspective views of a liquid crystal display device of Embodiment 5.
Figure 15B:
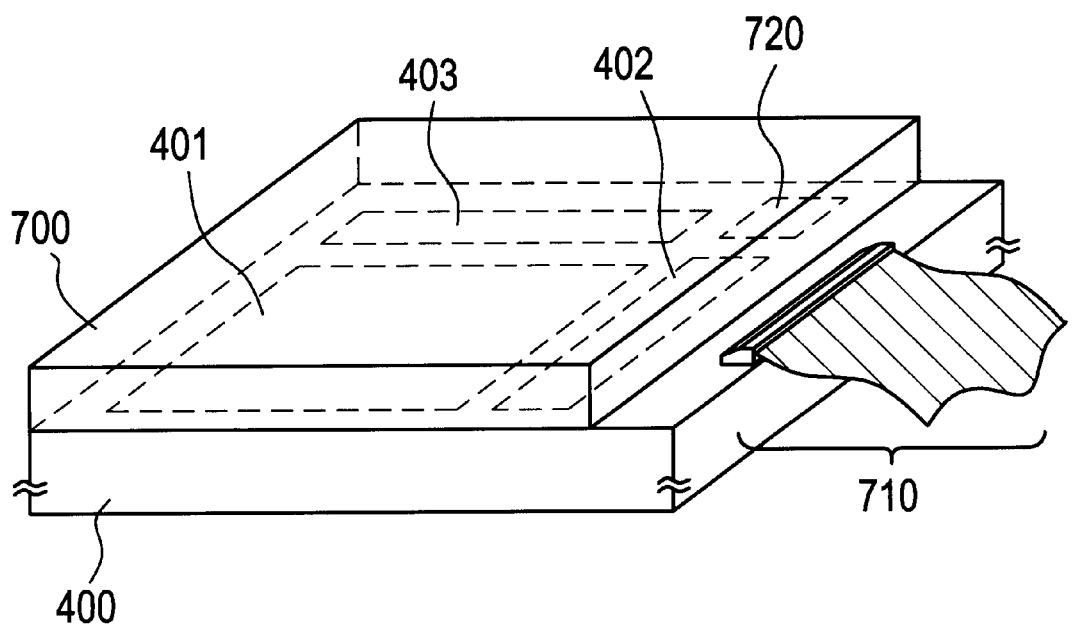

An external view of the AMLCD of Embodiment 5 is shown in FIGS. 15A and 15B. In FIG. 15A, symbols identical to those of FIG. 12 show identical constituent elements. The active matrix substrate has a pixel section 401, a scanning line driver circuit 402, and a signal line driver circuit 403 formed on a glass substrate 400.

The active matrix substrate and an opposing substrate 700 are joined together, and a liquid crystal is sealed in the space between the substrates. However, an external terminal is formed on the active matrix substrate by the TFT manufacturing process, and the area in which the external terminal is formed is not opposed to the opposing substrate 700. An FPC (flexible printed circuit) 710 is connected to the external terminal, and external signals and a power supply are transmitted through the FPC 710 to the circuits 401 to 403.

The opposing substrate 700 as ITO, etc., is formed with a transparent conductive film over the entire surface of a glass substrate. The transparent conductive film is an opposing electrode in opposition to the pixel electrode of the pixel section 401, and the liquid crystal material is driven by the electrical field formed between the pixel electrode and the opposing electrode. In addition, an orientation film and color filters are formed on the opposing substrate 700 when necessary.

IC chips 711 and 712 are installed on the surface of the active matrix substrate of Embodiment 5 where the FPC 710 is attached. The IC chips 711 and 712 are constituted by circuits such as video signal processing circuits, timing pulse generation circuits, a compensation circuits, memory circuits, and computation circuits, formed on a silicon substrate. There are two IC chips installed in FIG. 15A, but only one may be installed, and three or more may be installed.

The configuration of FIG. 15B is also possible. In FIG. 15B, symbols identical to those of FIG. 15A show identical constituent elements. An example is shown here in which the signal processing performed by the IC chips in FIG. 15A is performed by a logic circuit 720, which is formed on the same substrate by TFTs. In this case, the logic circuit 720 is also based on CMOS circuits, similar to the driver circuits 402 and 403.

A composition in which a black mask is formed on an active matrix substrate (BM on TFT) is employed in Embodiment 5, but in addition, it is possible to have a composition in which a black mask is also formed on the opposing side.

Further, color display may be performed by using color filters, and a composition in which the liquid crystals are driven in ECB (electric field control birefringence) mode, GH (guest host) mode, etc., without using color filters may be used. Additionally, a composition using a micro-lens eye may be used, as described in Japanese Patent Application Laid-open No. Hei 8-15686.

Embodiment 6

The TFTs shown in Embodiments 1, 2, and 3 can be applied to many types of electro-optical devices and semiconductor circuits other than AMLCDS.

EL (electroluminescence) display devices, image sensors, etc., can be given as examples of electro-optical devices other than AMLCDs.

In addition, computational processing circuits such as microprocessors which are structured by IC chips, and high frequency modules (MMIC, etc.) which handle the signal input and output for portable equipment can be given as examples of semiconductor circuits.

Thus it is possible to apply the present invention to all semiconductor devices that function in accordance with circuits constituted with insulating gate type TFTs.

Embodiment 7

In addition to nematic liquid crystals, it is possible to use many kinds of liquid crystals for the liquid crystal display devices of the present invention, stated above. For example, it is possible to use the liquid crystals disclosed in any of the following papers: Furue, H. et al, "Characteristics and Driving Scheme of Polymer-Stabilized Monostable FLCD Exhibiting Fast Response Time and High Contrast Ratio with Gray-Scale Capability", SID, 1998; Yoshida, T. et al, "A Full-Color Thresholdless Antiferroelectric LCD Exhibiting Wide Viewing Angle with Fast Response Time", SID Digest, 814, 1997; Inui, S. et al, "Thresholdless Antiferroelectricity in Liquid Crystals and its Application to Displays", J. Mater. Chem., 6(4), 1996, p. 671–3; and in U.S. Pat. No. 5,594,569.

Figure 16:
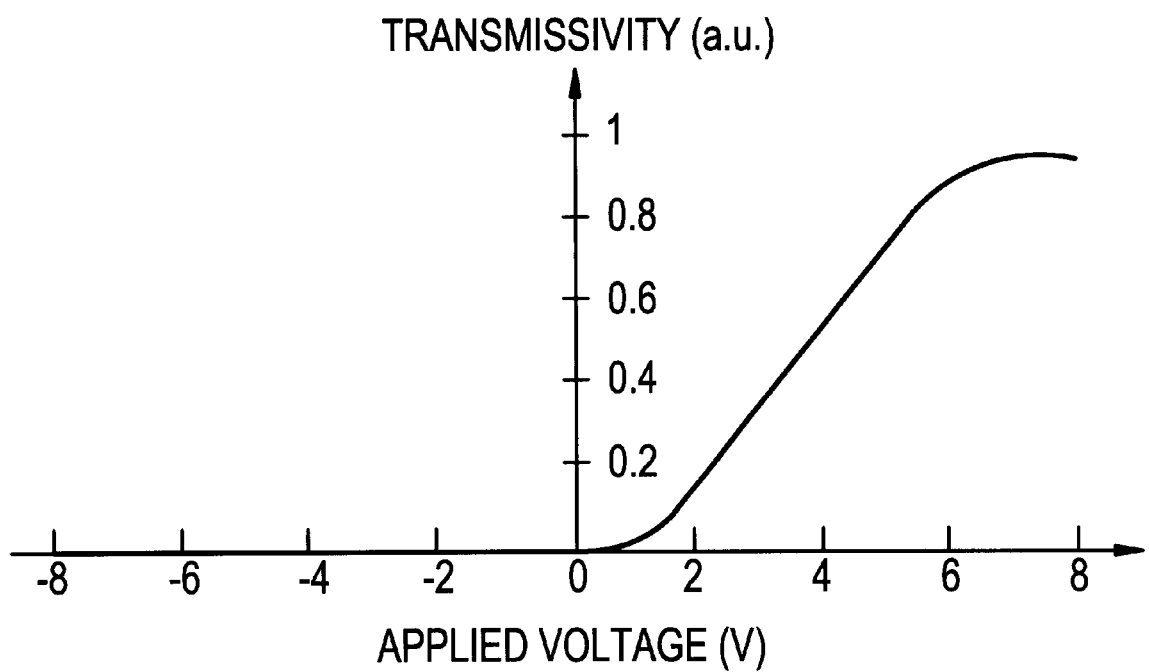
FIG. 16 is a diagram showing an example of an optical transmissivity characteristics of an antiferroelectric compound liquid crystal.

The resulting electro-optical characteristics of a monostable FLC, in which a phase transition system of an isotropic phase—cholesterol phase—chiralsmectic phase is used, and a phase transition is caused from the cholesterol phase to the chiralsmectic phase, in which the cone edge is made to nearly conform with the rubbing direction while applying a DC voltage, are shown in FIG. 16. The display mode of a ferroelectric liquid crystal like that shown in FIG. 16 is called "half-V switching mode." The vertical axis of the graph shown in FIG. 16 is the transmittance (in arbitrary units), and the horizontal axis is the applied voltage. Details regarding the "half-V switching mode" may be found in: Terada, et al, "Half-V Switching Mode FLCD", Proceedings of the 46th Applied Physics Association Lectures, Mar. 1999, p. 1316; and in Yoshihara, et al, "Time Partition Full Color LCD by Ferroelectric Liquid Crystal", Liquid Crystals, vol. 3, no. 3, p. 190.

As shown in FIG. 16, it is apparent that if this type of ferroelectric mixed liquid crystal is used, it is possible to have a low voltage drive and a gradation display. A ferroelectric liquid crystal that shows these electro-optical characteristics can be used for the liquid crystal display device of the present invention.

In addition, a liquid crystal that exhibits an anti-ferroelectric phase in a certain temperature range is called an anti-ferroelectric liquid crystal (AFLC). There are mixed liquid crystals, which have an anti-ferroelectric liquid crystal, that show electro-optical response characteristics in which the transmittance continuously changes in response to the electric field, and are called thresholdless antiferroelectric mixed liquid crystals. There are thresholdless antiferroelectric mixed liquid crystals that show V-type electro-optical r response characteristics, and some have been shown to have a drive voltage of approximately ±2.5 V (when the cell thickness is between 1 and 2 $\mu$m).

Further, in general the spontaneous polarization of a thresholdless antiferroelectric mixed liquid crystal is large, and the dielectric constant of the liquid crystal itself is high. It is thus necessary for a relatively large retention capacitance when a thresholdless antiferroelectric mixed liquid crystal is used for a liquid crystal display device. Therefore it is desirable to use a thresholdless antiferroelectric mixed liquid crystal that has a small spontaneous polarization.

Note that by using this type of thresholdless antiferroelectric mixed liquid crystal in the liquid crystal display devices of the present invention, a low drive voltage can be realized, so that low power consumption can also be realized.

Embodiment 8

An explanation of the example of manufacture of an active matrix type EL (electro-luminescence) display device using the present invention is given in Embodiment 8.

Figure 17A:
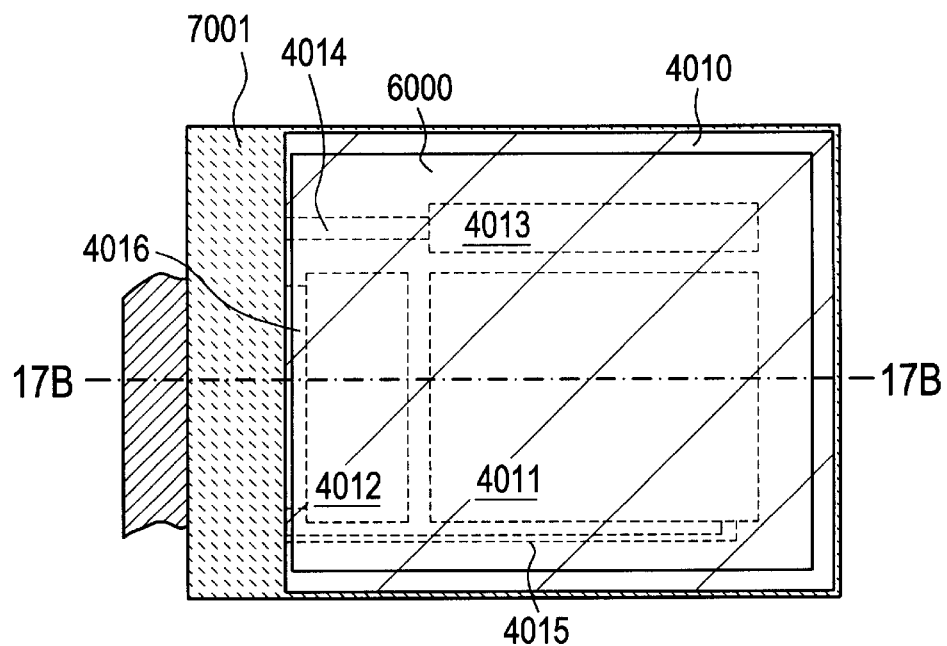
FIGS. 17A and 17B.are upper surface and cross sectional diagrams of an EL display devices of Embodiment 8.

FIG. 17A is a top view of an EL display device using the present invention. In FIG. 17A reference numeral 4010 denotes a substrate, 4011 denotes a pixel section, 4012 denotes a source side driver circuit, and 4013 denotes a gate side driver circuit. Both driver circuits lead to an FPC 4017 through gate wirings 4014 to 4016, and thus connect to external equipment.

A cover 6000, a sealing material (also called a housing material) 7000, and a sealant (a second sealing material) 7001 are formed around at least the pixel section, and desirably around both the pixel section and the driver circuits at this point.

Figure 17B:
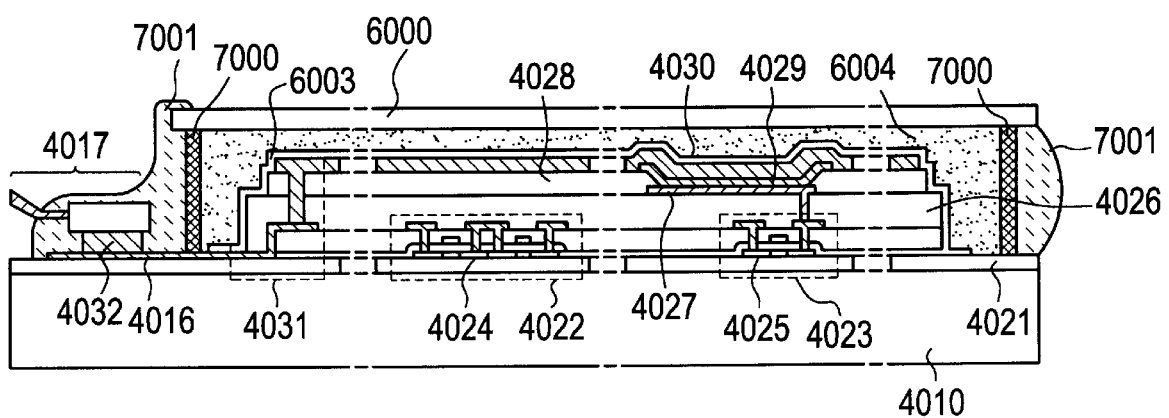

In addition, FIG. 17B is a cross sectional structure of the EL display device of Embodiment 8. A driver circuit TFT 4022 and a pixel section TFT 4023 (however, only the TFT that controls the current through the EL element is shown) are formed on the substrate 4010 and a base film 4021 (however, a CMOS circuit combining an n-channel type TFT and a p-channel type TFT is shown here). A known structure (top gate structure or bottom gate structure) may be used for the TFTs.

The present invention can be used for the driver circuit TFT 4022 and for the pixel section TFT 4023.

After completing the driver circuit TFT 4022 and the pixel section TFT 4023 using the present invention, a pixel electrode 4027 is formed by a transparent conductive film, on an interlayer insulating film (a leveling film) 4026 made from a resin material, in order to electrically connect to the drain of the pixel section TFT 4023. An indium oxide and tin oxide compound (called ITO), or an indium oxide and zinc oxide compound can be used as the transparent conductive film. Then, after forming the pixel electrode 4027, an insulating film 4028 is formed, and an opening is formed on the pixel electrode 4027.

An EL layer 4029 is formed next. Any known EL materials (hole injection layer, hole transport layer, illumination layer, electron transport layer, or electron injection layer) may be freely combined and used in a laminate structure or a single layer structure. A known technique may be used to determine the structure type. Further, there are low molecular weight materials and high molecular weight materials (polymers) as EL materials. An evaporation method is used for low molecular weight materials, but it is possible to use an easy method such as spin coating, printing, or injecting for high molecular weight materials.

The EL layer is formed in Embodiment 8 by an evaporation method using a shadow mask. By using a shadow mask and forming a luminescence layer that can emit different wavelengths of light for each pixel (red light emitting layer, green light emitting layer, and blue light emitting layer), color display is possible. Any other form may be used, such as combining color changing layers (CCM) with color filters, and combining white light emitting layers with color filters. Of course a single color light EL display device is also possible.

A cathode 4030 is then formed thereon after forming the EL layer 4029. It is desirable that to remove as much as possible the moisture and oxygen existing in the interface between the cathode 4030 and the EL layer 4029. Therefore, it is necessary to form the EL layer 4029 and the cathode 4030 inside a vacuum by successive film deposition, or to form the EL layer 4029 in an inert atmosphere and then form the cathode 4030 without exposure to the atmosphere. It is possible to perform the above film deposition in Embodiment 8 by using a multi-chamber system (cluster tool system) deposition device.

Note that a laminate structure of a LiF (lithium fluoride) film and an Al (aluminum) film is used for the cathode 4030 in Embodiment 8. Specifically, a 1 nm thick LiF (lithium fluoride) film is formed on the EL layer 4029 by evaporation, and a 300 nm thick aluminum film is formed on top of that. Of course an MgAg electrode, a known cathode material, may be used. Then the cathode 4030 is connected to the wiring 4016 in the region denoted by the reference numeral 4031. The wiring 4016 is a supply line in order to apply a preset voltage to the cathode 4030, and is connected to the FPC 4017 through a conductive paste material 4032.

The region denoted by reference numeral 4031 electrically connects the cathode 4030 and the wiring 4016, so that it is necessary to form contact holes in the interlayer insulating film 4026 and the insulating film 4028. The contact holes may be formed during etching of the interlayer insulating film 4026 (when forming the pixel electrode contact hole) and during etching of the insulating film 4028 (when forming the open section before forming the EL layer). Further, etching may proceed in one shot all the way to the interlayer insulating film 4026 when etching the insulating film 4028. In this case the contact holes can have a good shape provided that the interlayer insulating film 4026 and the insulating film 4028 are the same resin material.

The surface of the EL element thus formed is covered, and a passivation film 6003, a filler 6004, and the cover 6000 are formed.

In addition, a sealing material is formed on the inside of the cover 6000 and the substrate 4010, so as to surround the EL element section, and the sealant 7001 (the second sealing material) is formed on the outside of the sealing material 7000.

At this point the filler 6004 also functions as an adhesive to bond the cover 6000. PVC (polyvinyl chloride), epoxy resin, silicon resin, PVB (polyvinyl butyral), and EVA (ethylene vinyl acetate) can be used as the filler 6004. If a drying agent is formed on the inside of the filler 6004, a moisture absorption effect can be maintained, which is desirable.

Further, spacers may be included within the filler 6004. The spacers may be a powdered substance such as BaO, giving the spacers themselves the ability to absorb moisture.

When forming spacers, the passivation film 6003 can relieve the spacer pressure. Further, a resin film, etc., can be formed separately form the passivation film 6003 to relieve the spacer pressure.

In addition, a glass plate, an aluminum plate, a stainless steel plate, an FRP (fiberglass-reinforced plastic) plate, a PVF (polyvinyl fluoride) film, a Mylar film, a polyester film, or an acrylic film can be used as the cover 6000. Note that if PVB or EVA is used as the filler 6004, it is desirable to use a sheet with a structure in which several tens of μm of aluminum foil is sandwiched by a PVF film or a Mylar film.

However, it is necessary for the cover 6000 to have light transmission characteristics depending upon the light emission direction from the EL element (the light radiation direction).

In addition, the wiring 4016 is electrically connected to the FPC 4017 through the opening among the sealing material 7000, the sealant 7001, and the substrate 4010. Note that an explanation of the wiring 4016 has been made, and other wirings 4014 and 4015 are also connected electrically to the FPC 4017 by similarly passing underneath the sealant 7001 and the sealing material.

Embodiment 9

Figure 18A:
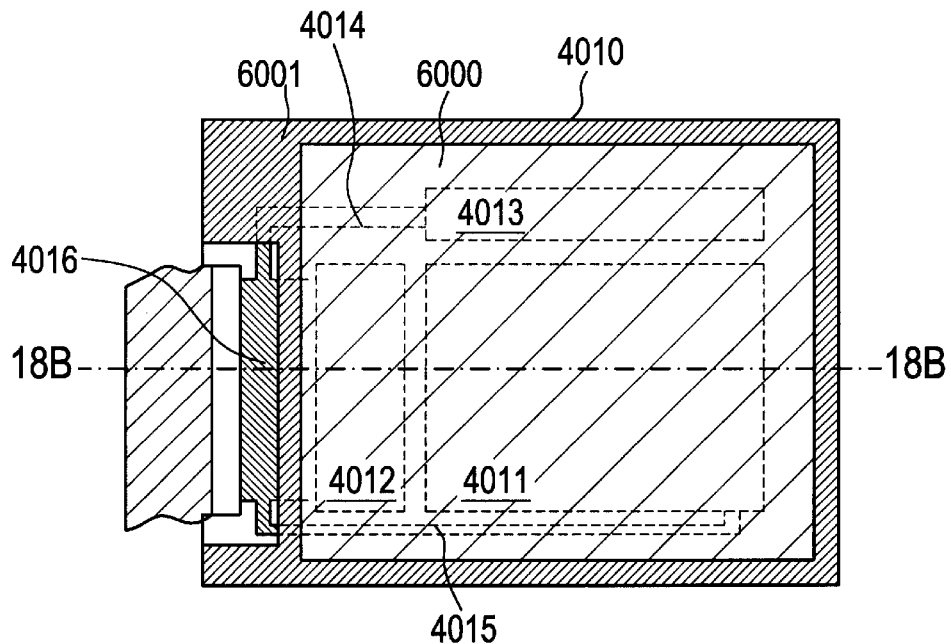
FIGS. 18A and 18B are upper surface and cross sectional diagrams of an EL display devices of Embodiment 9.
Figure 18B:
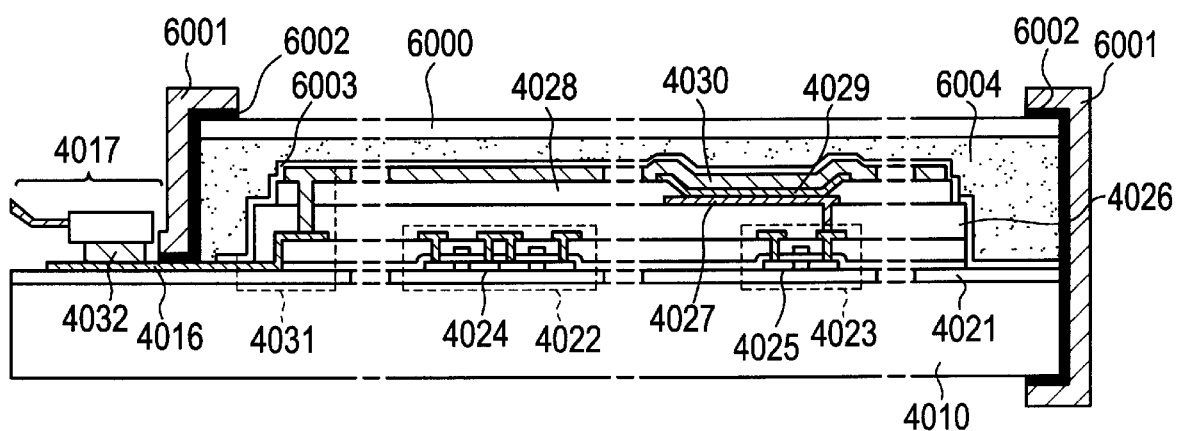

FIGS. 18A and 18B are used in Embodiment 9 to explain an example of the manufacture of an EL display device using the present invention, but with a different form from that of Embodiment 8. Reference numerals which are the same as in FIGS. 17A and 17B indicate the same sections, and therefore their explanation is omitted.

FIG. 18A is an upper surface diagram of the EL display device of Embodiment 9, and a cross sectional diagram cut along the section A–A' in FIG. 18A is shown in FIG. 18B.

Processing is performed in accordance with Embodiment 8 through the formation of the passivation film 6003 covering the surface of the EL element.

In addition, a filler 6004 is formed so as to cover the EL element. The filler 6004 also functions as an adhesive to bond to the cover 6000. PVC (polyvinyl chloride), epoxy resin, silicon resin, PVB (polyvinyl butyral), or EVA (ethylene vinyl acetate) can be used as the filler 6004. If a drying agent is formed on the inside of the filler 6004, a moisture absorption effect can be maintained, which is desirable.

Further, spacers may be included within the filler 6004. The spacers may be a powdered substance such as BaO, giving the spacers themselves the ability to absorb moisture.

When forming spacers, the passivation film 6003 can relieve the spacer pressure. Further, a resin film, etc., can be formed separately form the passivation film 6003 to relieve the spacer pressure.

In addition, a glass plate, an aluminum plate, a stainless steel plate, an FRP (fiberglass-reinforced plastic) plate, a PVF (polyvinyl fluoride) film, a Mylar film, a polyester film, or an acrylic film can be used as the cover 6000. Note that if PVB or EVA is used as the filler 6004, it is desirable to use a sheet with a structure in which several tens of 82 m of aluminum foil is sandwiched by a PVF film or a Mylar film.

However, it is necessary for the cover 6000 to have light transmission characteristics depending upon the light emission direction from the EL element (the light radiation direction).

A frame 6001 is attached so as to cover the side face (the exposed face) of the filler 6004 after bonding the cover 6000 using the filler 6004. The frame 6001 is bonded by a sealing material (functioning as an adhesive) 6002. It is desirable to use a light curing resin as the sealing material 6002 at this point, but if the heat resistance characteristics of the EL layer permit, then a thermal curing resin may also be used. Note that it is desirable that the sealing material 6002 be a material that is as impermeable as possible to water and oxygen. Further, a drying agent may be added on the inside of the sealing material 6002.

In addition, the wiring 4016 is electrically connected to the FPC 4017 through the opening between the sealing material 6002 and the substrate 4010. Note that an explanation of the wiring 4016 has been made, and other wirings 4014 and 4015 are also connected electrically to the FPC 4017 by similarly passing underneath the sealing material 6002.

Embodiment 10

The present invention can be used in an EL display panel with a structure like that in Embodiments 8 and 9. A more detailed cross sectional structure of a pixel section is shown here in FIG. 19, a top surface structure is shown in FIG. 20A, and a circuit diagram is shown in FIG. 20B. Common symbols are used in FIGS. 19, 20A, and 20B, so that they may be mutually referenced.

A switching TFT 3502 is formed on a substrate 3501 using an NTFT using the present invention. Note that FIG. 19 has the same structure as the NTFT of Embodiment 2, but the structures of Embodiment 1 and Embodiment 3 may also be used. A double gate structure is used in Embodiment 10, but there are no large differences in structure and manufacturing processes, so that explanation is omitted. However, by using a double gate structure, in essence the structure is two TFTs in series, which has the advantage that the off current value can be lowered. Note that although Embodiment 10 has a double gate structure, a single gate structure may also be used, as may a triple gate structure or a multiple gate structure having a larger number of gates. Further, the PTFT of the present invention may be used to form the TFT.

In addition, a current control TFT 3503 is formed using an NTFT using the present invention. At this point a drain wiring 35 of the switching TFT 3502 is electrically connected to a gate electrode 37 of the current control TFT by a wiring 36. Further, the wiring denoted by reference numeral 38 is a gate wiring that electrically connects gate electrodes 39a and 39b on the switching TFT 3502.

The fact that the current control TFT 3503 has the structure of Embodiment 10 has an extremely important meaning at this point. A current control TFT is an element for controlling the amount of current flowing in an EL element, and there is much current flow, so that it is an element in which there is a great danger of degradation due to heat or due to hot carriers. Therefore, the structure of the present invention, in which an LDD region is formed to overlap a gate electrode through a gate insulating film, is extremely effective on the drain side of the current control TFT.

Additionally, a single gate structure is shown in the figures for the current control TFT 3503 in Embodiment 10, but a multiple gate structure, with a plural number of TFTs connected in series, may also be used. Further, a structure so as to perform heat radiation with a high efficiency, in which a plural number of TFTs are connected in parallel, in essence dividing the channel forming region into a plural number of channel forming regions, may also be used. This type of structure is an effective countermeasure to heat degradation.

In addition, the wiring that becomes the gate electrode 37 of the current control TFT 3503 is the region shown by reference numeral 3504, and overlaps a drain wiring 40 on the current control TFT 3503, through an insulating film, as shown in FIG. 20A. At this point a capacitor is formed in the region shown by reference numeral 3504. The capacitor 3504 functions as a capacitor in order to retain the voltage applied to the gate on the current control TFT 3503. Note that the drain wiring 40 is connected to a current supply line (voltage supply line) 3506, and a fixed voltage is always applied.

A first passivation film 41 is formed on the switching TFT 3502 and the current control TFT 3503, and a leveling film 42 is formed on top of that by an insulating resin film. It is very important to level the step due to the TFTs using the leveling film 42. An EL layer formed later is extremely thin, so that there are cases which cause the luminescence to be defective due to the step. Therefore, to form the EL layer with as level a surface as possible, it is desirable to perform leveling before forming a pixel electrode.

In addition, reference numeral 43 denotes a pixel electrode (EL element cathode) from a conductive film with high reflectivity, and is electrically connected to the drain of the current control TFT 3503. It is desirable to use a low resistance conductive film, such as an aluminum alloy film, a copper alloy film, and a silver alloy film, or a laminate of such films. Of course a laminate structure with other conductive films may be used.

Furthermore, a luminescence layer 45 is formed in the middle of the groove (corresponding to the pixel) formed by banks 44a and 44b formed by insulating films (desirably resins). Note that only one pixel is shown in the figures here, but the luminescence layer may be divided to correspond to each of the colors R (red), G (green), and B (blue). A n conjugate polymer material is used as an organic EL material as the luminescence layer. Polyparaphenylene vinylenes (PPVs), polyvinyl carbazoles (PVCs), and polyfluoranes can be given as typical polymer materials.

Note that there are several types of PPV organic EL materials, and materials described in Shenk, H., Becker, H., Gelsen, O., Kluge, E., Kreuder, W., and Spreitzer, H., "Polymers for Light Emitting Diodes", Euro Display Proceedings, 1999, pp. 33–7, and in Japanese Patent Application Laid-open No. Hei 10-92567, for example, may be used.

As specific luminescence layers, cyano-polyphenylene vinylene may be used as a red light radiating luminescence layer, polyphenylene vinylene may be used as a green light radiating luminescence layer, and polyphenylene vinylene or polyalkylphenylene may be used as a blue light radiating luminescence layer. The film thicknesses may be between 30 and 150 nm (desirably between 40 and 100 nm).

However, the above example is one example of the organic EL materials which can be used as luminescence layers, and it is not necessary to limit use to these materials. An EL layer (a layer for luminescence and for performing carrier motion for luminescence) may be formed by freely combining luminescence layers, charge carrier layers, and charge injection layers.

For example, Embodiment 10 shows an example using polymer materials as luminescence layers, but low molecular weight organic EL materials may also be used. Further, it is possible, to use inorganic materials such as silicon carbide, as charge carrier layers and charge injection layers. Known materials can be used for these organic EL materials and inorganic materials.

A laminar structure EL layer, in which a hole injection layer 46 from PEDOT (polythiophene) or PAni (polyaniline) is formed on the luminescence layer 45, is used in Embodiment 10. An anode 47 is then formed on the hole injection layer 46 from a transparent conductive film. The light generated by the luminescence layer 45 is radiated toward the upper surface (toward the top of the TFT) in the case of Embodiment 10, so that the anode must be transparent to light. An indium oxide and tin oxide compound, or an indium oxide and zinc oxide compound can be used for the transparent conductive film. However, because it is formed after forming the low heat resistance luminescence layer and hole injection layer, it is desirable to use a material which can be deposited at as low a temperature as possible.

At the point where the anode 47 is formed, and EL element 3505 is completed. Note that what is called the EL element 3505 here indicates the capacitor formed by the pixel electrode (cathode) 43, the luminescence layer 45, the hole injection layer 46, and the anode 47. As shown in FIG. 20A, the pixel electrode 43 is nearly matches the area of the pixel, so that the entire pixel functions as an EL elment. Therefore, the luminescence usage efficiency is very high, and a bright image display is possible.

A further second passivation film 48 is then formed on the anode 47 in Embodiment 10. It is desirable to use a silicon nitride film or an oxidized silicon nitride film as the second passivation film 48. The purpose of this is the isolation of the EL element and the outside, and has meaning in preventing degradation due to the oxidation of the organic EL material, and in controlling gaseous emitted from the organic EL material. Thus the reliability of an EL display device can be raised.

Figure 19:
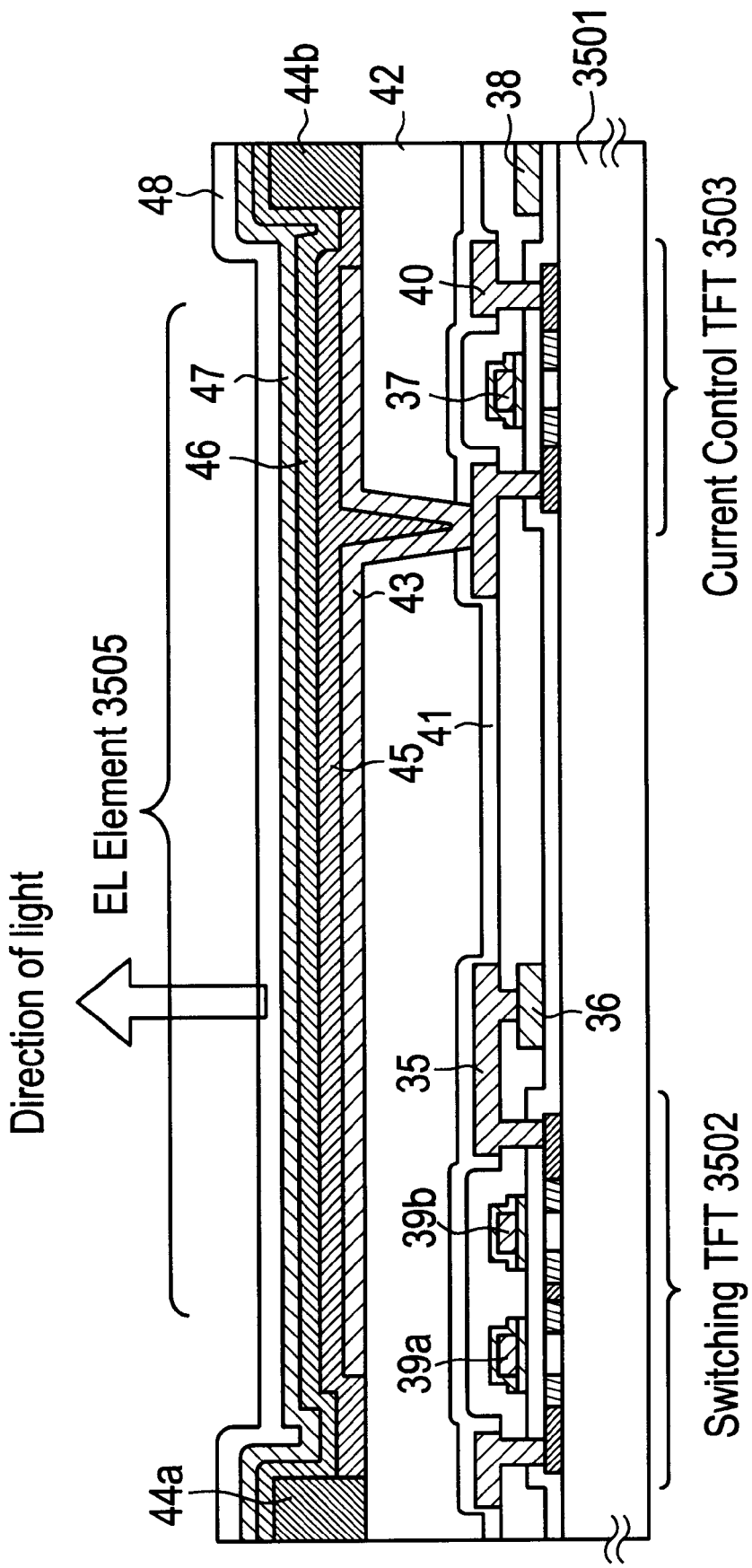
FIG. 19 is a cross sectional diagram of an EL display device of Embodiment 10.
Figure 20A:
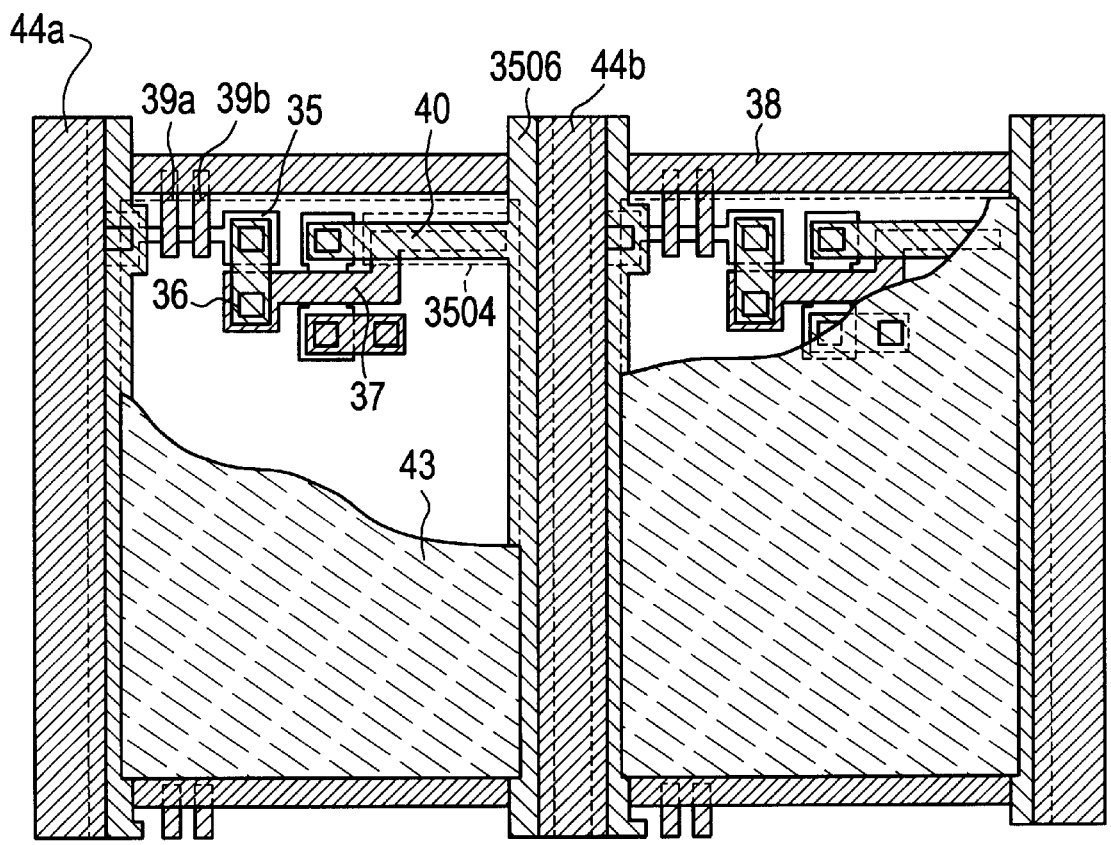
FIGS. 20A and 20B are upper surface and circuit diagrams of the EL display device of Embodiment 10.
Figure 20B:
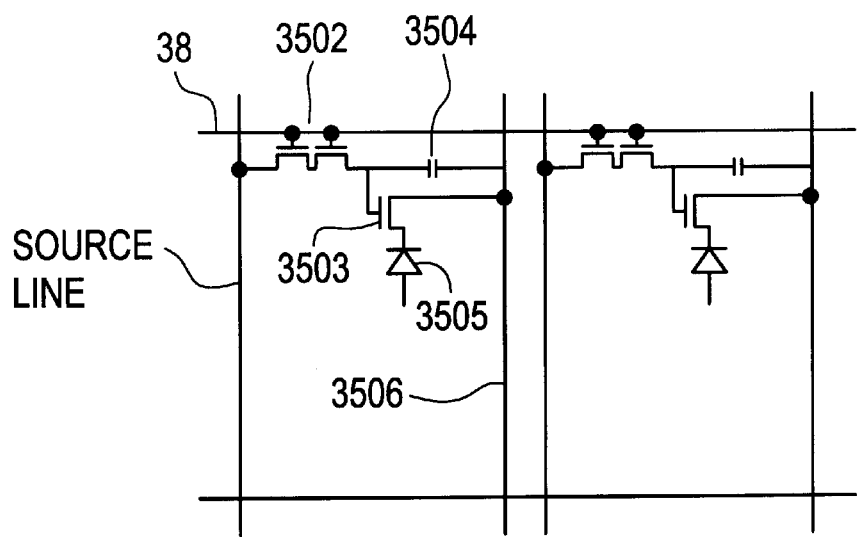

Thus the EL display panel of Embodiment 10 has a pixel section from pixels structured as in FIG. 19, and has a switching TFT with sufficiently low of OFF current value, and a current control TFT with strong hot carrier injection. Therefore, an EL display panel which has high reliability, and in which good image display is possible, can be obtained.

Note that it is possible to implement the constitution of Embodiment 10 by freely combining it with the constitutions of Embodiments 1 to 3.

Embodiment 11

Figure 21:
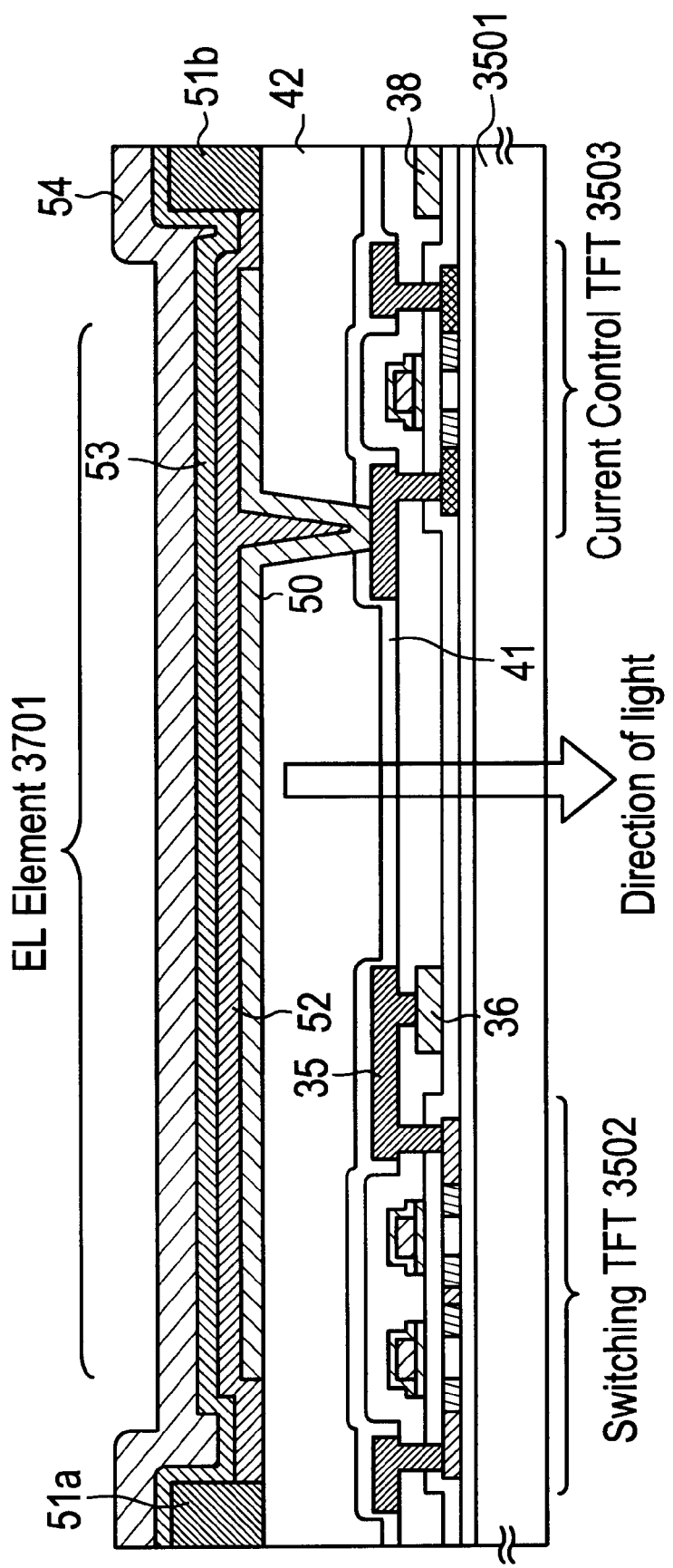
FIG. 21 is a cross sectional diagram of an EL display device of Embodiment 11.

A structure is explained in Embodiment 11 in which the structure of the EL element 3505, from the pixel section shown in Embodiment 10, is inverted. FIG. 21 is used in the explanation. Note that the only points that are different from the structure of FIG. 19 are the EL element section and the current control TFT, so that other explanations are omitted.

The current control TFT 3503 in FIG. 21 is formed using the PTFT of the present invention. Note that the structure in FIG. 21 is the same as the PTFT of Embodiment 2, but the structures of Embodiment 1 and Embodiment 3 may also be used.

A transparent conductive film is used as a pixel electrode (anode) in Embodiment 10. Specifically, an indium oxide and zinc oxide compound conductive film is used. Of course, an indium oxide and tin oxide compound conductive film may also be used.

After then forming banks 51a and 51b from insulating films, a luminescence layer 52 is formed from polyvinyl carbazole by solution coating. An electron injection layer 53 is formed on top from potassium acetylacetonate (denoted acacK), and a cathode 54 is formed from an aluminum alloy. In this case the cathode 54 also functions as a passivation film. Thus an EL element 3701 is formed.

The light generated by the luminescence layer 52 is radiated toward the substrate on which the TFT is formed in Embodiment 11, as shown by the arrows.

Note that it is possible to implement the constitution of Embodiment 11 by freely combining it with the constitutions of Embodiments 1 to 3.

Embodiment 12

Figure 22A:
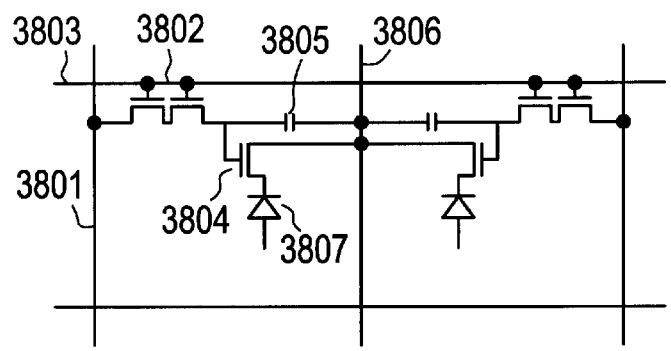
FIGS. 22A to 22C are circuit diagrams of an EL display device of Embodiment 12.
Figure 22B:
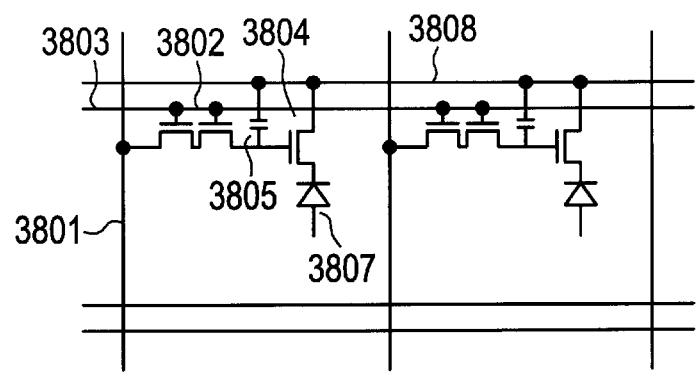
Figure 22C:
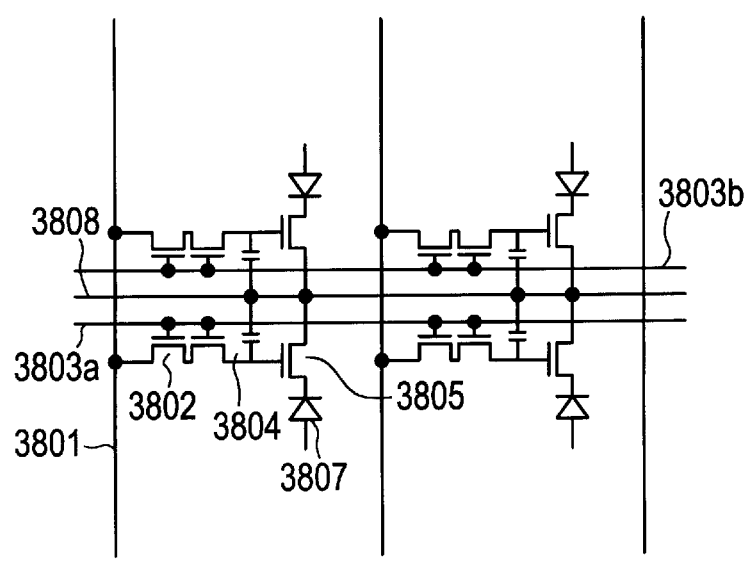

An example of a case where a pixel has a different structure from that of the circuit diagram of FIG. 20B is shown in FIGS. 22A to 22C for Embodiment 12. Note that in Embodiment 12, reference numeral 3801 denotes a source wiring of a switching TFT 3802, 3803 denotes a gate wiring of the switching TFT 3802, 3804 denotes a current control TFT, 3805 denotes a capacitor, 3806 and 3808 denote current supply lines, and 3807 denotes an EL element.

FIG. 22A is an example of a case in which the current supply line 3806 is shared between two pixels. Namely, this is characterized in that two pixels are formed having linear symmetry around the current supply line 3806. In this case the number of power supply lines an be reduced, so that the pixel section can be made more higher definition.

In addition, FIG. 22B is an example of a case in which the current supply line 3808 is formed parallel to the gate wiring 3803. Note that FIG. 22B has a structure in which the current supply line 3808 and the gate wiring 3803 are formed so as not to overlap, but if both are wirings formed on different layers, then they can be formed to overlap through an insulating film. In this case the area used exclusively by the current supply line 3808 and the gate wiring 3803 can be shared, so that the pixel section can be made more higher definition.

Furthermore, FIG. 22C is characterized in that the current supply line 3808 is formed parallel to the gate wiring 3803, similar to the structure of FIG. 22B, and in addition, two pixels are formed to have linear symmetry around the current supply line 3808. It is also effective to form the current supply line 3808 to overlap one gate wiring 3803. In this case the number of power supply lines can be reduced, so that the pixel section can be made more higher definition.

Note that it is possible to implement the constitution of Embodiment 12 by freely combining it with the constitutions of Embodiments 1 to 3, 8, or 9.

Embodiment 13

A structure in which a capacitor 3504 is formed in order to retain the voltage applied to the current control TFT 3503 gate is used in FIGS. 20A and 20B, which is show in Embodiment 10, but it is possible to omit the capacitor 3504. An NTFT with the same structure as that of Embodiment 2 is used as the current control TFT 3503 for the case of Embodiment 10, so that it has an LDD region formed so as to overlap the gate electrode through a gate insulating film. A parasitic capacitor, called a gate capacitor, is generally formed in the overlapped region, and Embodiment 13 is characterized in that the parasitic capacitor is actively used as a substitute for the capacitor 3504.

The capacitance of the parasitic capacitor changes in accordance with the area of the overlapped between the gate electrode and the LDD region, so that the length of the LDD region in the overlapped region determines the capacitance.

Further, it is possible to similarly omit the capacitor 3805 in the structures of FIGS. 22A, 22B, and 22C, which is show in Embodiment 12.

Note that it is possible to implement the constitution of Embodiment 13 by freely combining it with the constitutions of Embodiments 1 to 3, and 8 to 12.

Embodiment 14

A CMOS circuit and a pixel matrix circuit formed through carrying out the present invention may be applied to various display devices (active matrix type liquid crystal displays, active matrix type EL displays, active matrix type EC displays). Namely, the present invention may be embodied in all the electronic equipments that incorporate those display devices into display units.

As such an electronic equipment, a video camera, a digital camera, a projector (rear-type or front-type projector), a head mount display (goggle-type display), a navigation system for vehicles, a stereo for vehicles, a personal computer, and a portable information terminal (a mobile computer, a cellular phone, or an electronic book, etc.) may be enumerated. Examples of those are shown in FIGS. 23A to 25C.

Figure 23A:
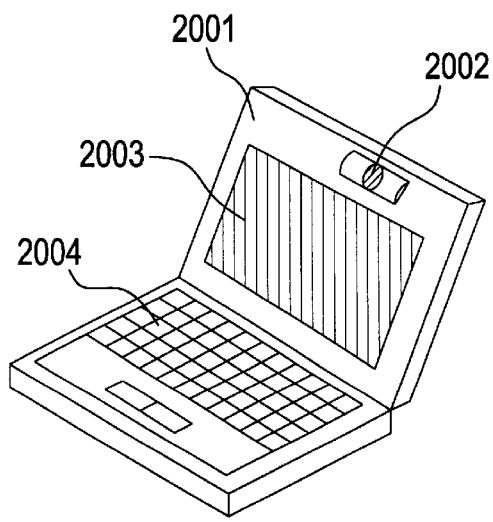
FIGS. 23A to 23F are structural diagrams of electronic equipment of Embodiment 14.

FIG. 23A shows a personal computer comprising a main body 2001, an image inputting unit 2002, a display unit 2003, and a key board 2004 and the like. The present invention is applicable to the image inputting unit 2002, the display unit 2003, and other signal control circuits.

Figure 23B:
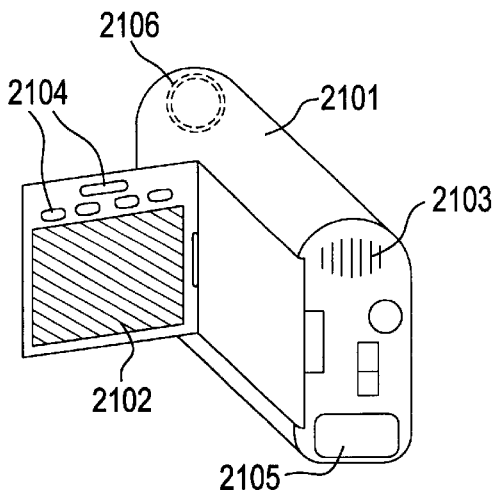

FIG. 23B shows a video camera comprising a main body 2101, a display unit 2102, a voice input unit 2103, operation switches 2104, a battery 2105, and an image receiving unit 2106 and the like. The present invention is applicable to the display unit 2102 and other signal control circuits.

Figure 23C:
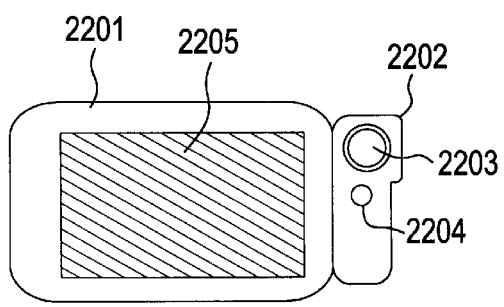

FIG. 23C shows a mobile computer comprising a main body 2201, a camera unit 2202, an image receiving unit 2203, an operation switch 2204, and a display unit 2205 and the like. The present invention is applicable to the display unit 2205 and other signal control circuits.

Figure 23D:
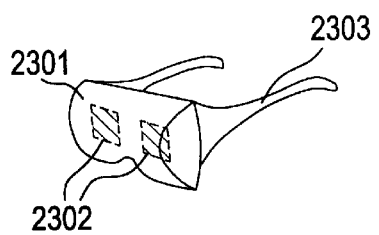

FIG. 23D shows a goggle-type display comprising a main body 2301, a display unit 2302 and arm portions 2303 and the like. The present invention is applicable to the display unit 2302 and other signal control circuits.

Figure 23E:
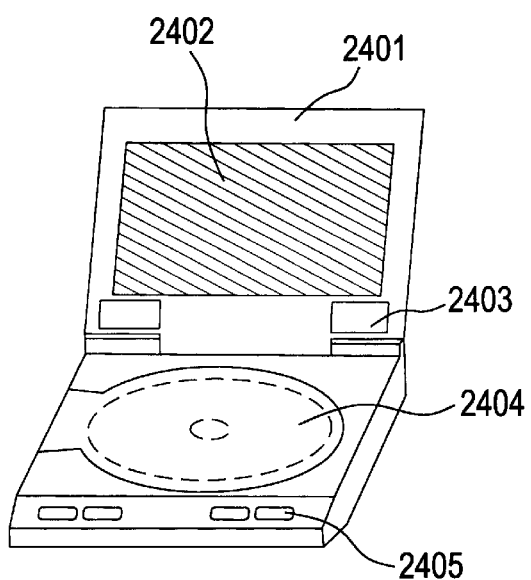

FIG. 23E shows a player that employs a recoding medium in which programs are recorded (hereinafter referred to as recording medium), and comprises a main body 2401, a display unit 2402, a speaker unit 2403, a recording medium 2404, and an operation switch 2405 and the like. Incidentally, this player uses as the recoding medium a DVD (digital versatile disc), a CD and the like to serve as a tool for enjoying music or movies, for playing video games and for connecting to the Internet. The present invention is applicable to the display unit 2402 and other signal control circuits.

Figure 23F:
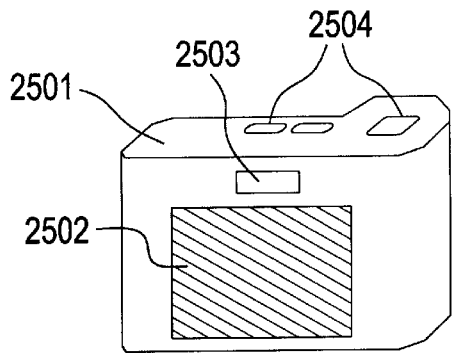

FIG. 23F shows a digital camera comprising a main body 2501, a display unit 2502, an eye piece section 2503, operation switches 2504, and an image receiving unit (not shown) and the like. The present invention is applicable to the display unit 2502 and other signal control circuits.

Figure 24A:
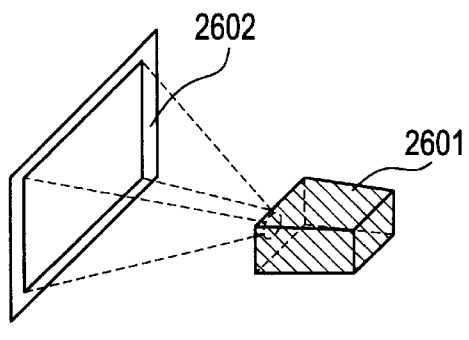
FIGS. 24A to 24D are structural diagrams of electronic equipment of Embodiment 14.

FIG. 24A shows a front-type projector comprising a projection device 2601, a screen 2602 and the like. The present invention is applicable to a liquid crystal display device 2808 that constitutes a part of the projection device 2601 and other signal control circuits.

Figure 24B:
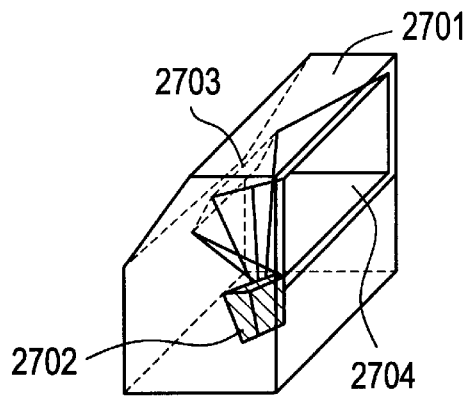

FIG. 24B shows a rear-type projector comprising a main body 2701, a projection device 2702, a mirror 2703, and a screen 2704 and the like. The present invention is applicable to the liquid crystal display device 2808 that constitutes a part of the projection device 2702 and other signal control circuits.

Figure 24C:
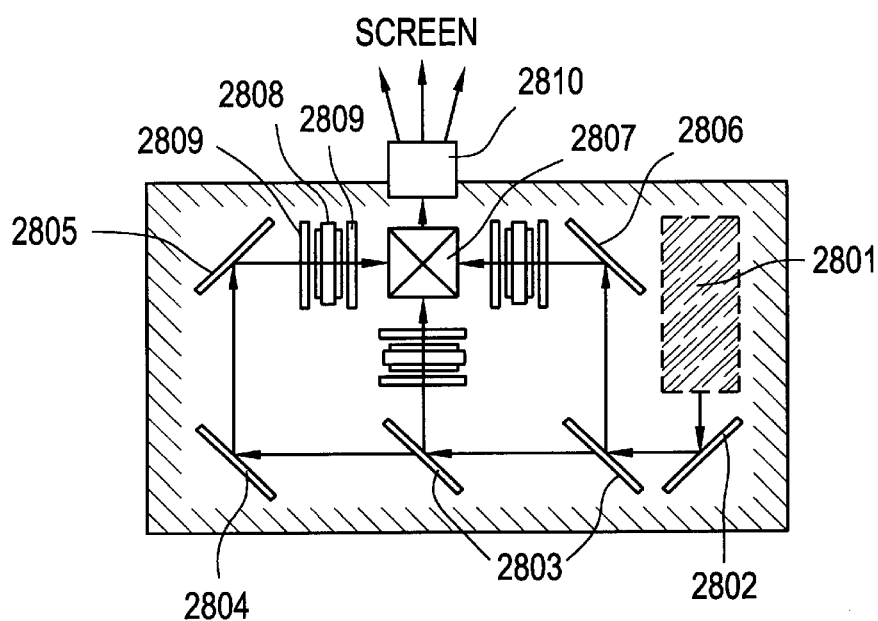

FIG. 24C is a diagram showing an example of the structure of the projection devices 2601 and 2702 in FIGS. 24A and 24B. The projection device 2601 or 2702 comprises a light source optical system 2801, mirrors 2802 and 2804 to 2806, dichroic mirrors 2803, a prism 2807, liquid crystal display devices 2808, phase difference plates 2809, and a projection optical system 2810. The projection optical system 2810 consists of an optical system including a projection lens. This embodiment shows an example of "three plate type", but not particularly limited thereto. For instance, the invention may be applied also to "single plate type". Further, in the light path indicated by an arrow in FIG. 24C, an optical system such as an optical lens, a film having a polarization function, a film for adjusting a phase difference and an IR film may be provided on discretion of a person who carries out the invention.

Figure 24D:
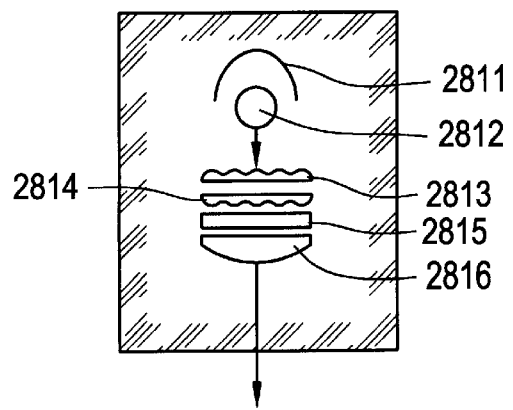

FIG. 24D is a diagram showing an example of the structure of the light source optical system 2801 in FIG. 24C. In this embodiment, the light source optical system 2801 comprises a reflector 2811, light source 2812, lens arrays 2813 and 2814, a polarization conversion element 2815, and a condenser lens 2816. The light source optical system shown in FIG. 24D is an example thereof, and is not particularly limited. For instance, on discretion of a person who carries out the invention, the light source optical system may be provided with an optical system such as an optical lens, a film having a polarization function, a film for adjusting the phase difference and an IR film.

The projector shown in FIG. 24 shows the case in which the display device of transmission type is employed and an application example using the display device of reflective type and the EL display device is not illustrated.

Figure 25A:
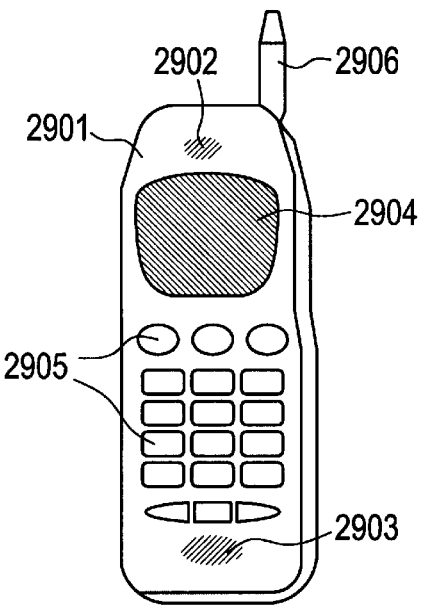
FIGS. 25A to 25C are structural diagrams of electronic equipment of Embodiment 14.

FIG. 25A is a cellular phone that is composed of a main body 2901, a voice output unit 2902, a voice input unit 2903, a display unit 2904, operation switches 2905, and an antenna 2906 and the like. The present invention can be applied to the voice output unit 2902, the voice input unit 2903 and the display unit 2904 and other signal control circuits.

Figure 25B:
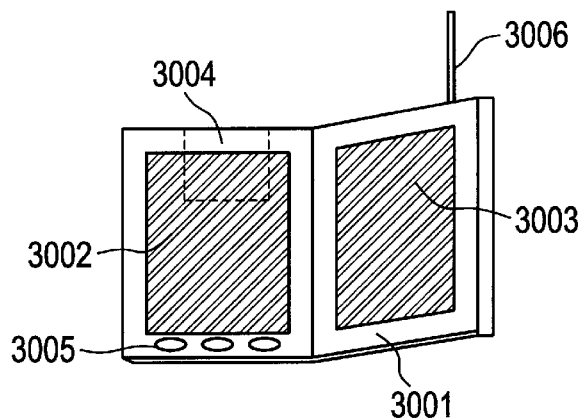

FIG. 25B shows a portable book (electronic book) that is comprised of a main body 3001, display units 3002 and 3003, a memory medium 3004, an operation switch 3005 and an antenna 3006 and the like. The present invention can be applied to the display units 3002 and 3003 and other signal circuits.

Figure 25C:
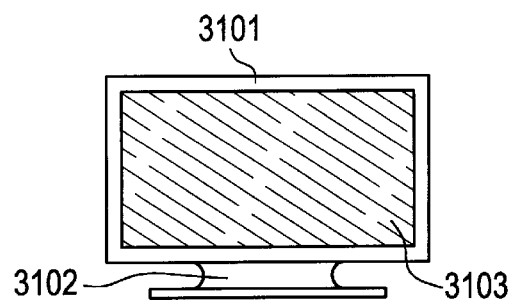

FIG. 25C shows a display that is comprised of a main body 3101, a support base 3102 and a display unit 3103 and the like. The present invention can be applied to the display unit 3103. The display according to the present invention is advantageous in the case where the display is particularly large-sized and in the case where the display is 10 inches or more in an opposite angle (particularly 30 inches or more).

As described above, the present invention has so wide application range that it is applicable to electronic equipments in any field. In addition, the electronic equipments of this embodiment may be realized with any construction obtained by combining Embodiments 1 through 6 and 8 through 13.

The present invention forms a gettering region in contact with a region to be gettered when using a technique of crystallizing a semiconductor film, or of increasing crystallinity, which uses a crystallization promoting element, so that the removal process of the crystallization promoting element can be shortened, and it is possible to perform the crystallization promoting element removal process with good efficiency. In addition, it is possible to lower the process temperature of the crystallization promoting element removal process to below 600° C., so that it is fully possible to use a glass substrate.

What is claimed is:

1. A manufacturing method of a semiconductor device, comprising the steps of:
    forming a semiconductor film;
    introducing an element that promotes crystallization into the semiconductor film;
    crystallizing the semiconductor film after introducing the element that promotes crystallization;
    selectively doping a group 15 element into the crystallized semiconductor film;
    selectively doping a group 13 element into at least a part of the crystallized semiconductor film into which the group 15 element is doped;
    heating the semiconductor film after the doping of the group 15 element and after the doping of the group 13 element; and
    patterning the semiconductor film and forming an island-like semiconductor layer,
        wherein the patterning is performed so that the region doped with the group 15 element becomes a source region and a drain region, and the region not doped with the group 15 element becomes either a channel forming region or a channel forming region and a low impurity concentration region.

2. A method according to claim 1, wherein the group 13 element is selected from the group consisting of B, Al, Ga, In and Ti.

3. A method according to claim 1, wherein the semiconductor film is heated at between 450 and 650° C. in step C.

4. A method according to claim 1, wherein the semiconductor film is heated at between 500 and 850° C. in step E.

5. A method according to claim 1, wherein the semiconductor film is an amorphous silicon film deposited by reduced pressure CVD in step A.

6. A method according to claim 1, wherein one or more elements selected from the group consisting of Ni, Fe, Co, Ru, Rh, Pd, Os, Ir, Pt, Cu, Au, and Ge are used as the element that promotes crystallization in step B.

7. An active matrix type display device manufactured using the manufacturing method according to claim 1.

8. Electronic equipment equipped with the active matrix type display device according to claim 7.

9. An EL display device manufactured using the manufacturing method according to claim 1.

10. Electronic equipment equipped with the EL display device according to claim 9.

11. A manufacturing method of a semiconductor device, comprising the steps of:
    forming a semiconductor film;
    introducing an element that promotes crystallization into the semiconductor film;
    crystallizing the semiconductor film after introducing the element that promotes crystallization;
    selectively doping a group 15 element into the crystallized semiconductor film;
    selectively doping a group 13 element into at least a part of the crystallized semiconductor film into which the group 15 element is doped;
    heating the semiconductor film after the doping of the group 15 element and after the doping of the group 13 element;
    patterning the semiconductor film and forming an island-like semiconductor layer;
    forming a gate insulating film in contact with the island-like semiconductor layer; and
    forming a gate electrode, through the gate insulating film, over the region of the island-like semiconductor layer not doped with the group 15 element.

12. A method according to claim 11, wherein the group 13 element is selected from the group consisting of B, Al, Ga, In and Ti.

13. A method according to claim 11, wherein the semiconductor film is heated at between 450 and 650° C. in step C.

14. A method according to claim 11, wherein the semiconductor film is heated at between 500 and 850° C. in step E.

15. A method according to claim 11, wherein the semiconductor film is an amorphous silicon film deposited by reduced pressure CVD in step A.

16. A method according to claim 11, wherein one or more elements selected from the group consisting of Ni, Fe, Co, Ru, Rh, Pd, Os, Ir, Pt, Cu, Au, and Ge are used as the element that promotes crystallization in step B.

17. An active matrix type display device manufactured using the manufacturing method according to claim 11.

18. Electronic equipment equipped with the active matrix type display device according to claim 17.

19. An EL display device manufactured using the manufacturing method according to claim 11.

20. Electronic equipment equipped with the EL display device according to claim 19.

21. A manufacturing method of a semiconductor device, comprising the steps of:

forming a semiconductor film;

introducing an element that promotes crystallization into the semiconductor film;

crystallizing the semiconductor film after introducing the element that promotes crystallization;

doping a group 15 element into the crystallized semiconductor film, including a region that becomes a source region and a region that becomes a drain region, and not including either a region that becomes a channel forming region or a region that becomes a channel forming region and a low impurity concentration region;

doping a group 13 element into at least a part of the crystallized semiconductor film into which the group 15 element is doped;

gettering the element that promotes crystallization in the region doped with the group 15 element;

patterning the semiconductor film and forming an island-like semiconductor layer;

forming a gate insulating film in contact with the island-like semiconductor layer; and forming a gate electrode, through the gate insulating film, over the region of the island-like semiconductor layer that becomes the channel forming region.

22. A method according to claim 21, wherein the group 13 element is selected from the group consisting of B, Al, Ga, In and Ti.

23. A method according to claim 21, wherein the semiconductor film is heated at between 450 and 650° C. in step C.

24. A method according to claim 21, wherein the semiconductor film is heated at between 500 and 850° C. in step E.

25. A method according to claim 21, wherein the semiconductor film is an amorphous silicon film deposited by reduced pressure CVD in step A.

26. A method according to claim 21, wherein one or more elements selected from the group consisting of Ni, Fe, Co, Ru, Rh, Pd, Os, Ir, Pt, Cu, Au, and Ge are used as the element that promotes crystallization in step B.

27. An active matrix type display device manufactured using the manufacturing method according to claim 21.

28. Electronic equipment equipped with the active matrix type display device according to claim 27.

29. An EL display device manufactured using the manufacturing method according to claim 21.

30. Electronic equipment equipped with the EL display device according to claim 29.

31. A manufacturing method of a semiconductor device, comprising the steps of:

forming a semiconductor film;

introducing an element that promotes crystallization into the semiconductor film;

crystallizing the semiconductor film after introducing the element that promotes crystallization;

selectively doping a group 15 element into the crystallized semiconductor film;

selectively doping a group 13 element into at least a part of the crystallized semiconductor film into which the group 15 element is doped;

heating the semiconductor film after the doping of the group 15 element and after the doping of the group 13 element;

patterning the semiconductor film and forming an island-like semiconductor layer;

forming a gate insulating film in contact with the island-like semiconductor layer;

forming a gate electrode, through the gate insulating film, over a portion of the region of the island-like semiconductor layer into which the group 15 element is not doped; and doping an impurity element using the gate electrode as a mask.

32. A method according to claim 31, wherein the group 13 element is selected from the group consisting of B, Al, Ga, In and Ti.

33. A method according to claim 31, wherein the semiconductor film is heated at between 450 and 650° C. in step C.

34. A method according to claim 31, wherein the semiconductor film is heated at between 500 and 850° C. in step E.

35. A method according to claim 31, wherein the semiconductor film is an amorphous silicon film deposited by reduced pressure CVD in step A.

36. A method according to claim 31, wherein one or more elements selected from the group consisting of Ni, Fe, Co, Ru, Rh, Pd, Os, Ir, Pt, Cu, Au, and Ge are used as the element that promotes crystallization in step B.

37. An active matrix type display device manufactured using the manufacturing method according to claim 31.

38. Electronic equipment equipped with the active matrix type display device according to claim 37.

39. An EL display device manufactured using the manufacturing method according to claim 31.

40. Electronic equipment equipped with the EL display device according to claim 39.

41. A manufacturing method of a semiconductor device, comprising the steps of:

forming a semiconductor film over a substrate;

introducing a crystallization promotion element into the semiconductor film;

crystallizing the semiconductor film after introducing the crystallization promotion element;

selectively doping a gettering element into the crystallized semiconductor film;

gettering the crystallization promotion element into a part of the semiconductor film into which the gettering element is doped; and patterning the semiconductor film into a semiconductor island after the gettering step, wherein the semiconductor island comprises a region to become a source region, and a region to become a drain region and a region to become a channel forming region to be located between the source region and the drain region.

42. A method according to claim 41 wherein at least one element selected from the group consisting of Ni, Fe, Co, Ru, Rh, Pd, Os, Ir, Pt, Cu, Au and Ge is used as the crystallization promotion element.

43. A method according to claim 41 wherein the gettering element is selected from the group consisting of P, As, N, Sb and Bi.

44. A method according to claim 41 wherein the gettering element is selected from the group consisting of B, Al, Ga, In and Ti.

* * * * *